(12) United States Patent
Rogers

(10) Patent No.: US 11,043,816 B2
(45) Date of Patent: Jun. 22, 2021

(54) ENERGY GENERATION LOAD COMPENSATION

(71) Applicant: HONEY BADGER INTERNATIONAL PTY LTD., Tweed Heads (AU)

(72) Inventor: Gregory Neville Rogers, Tweed Heads (AU)

(73) Assignee: HONEY BADGER INTERNATIONAL PTY LTD., Tweed Heads (AU)

( * ) Notice: Subject to any disclaimer, the term of this patent is extended or adjusted under 35 U.S.C. 154(b) by 0 days.

(21) Appl. No.: 16/441,571

(22) Filed: Jun. 14, 2019

(65) Prior Publication Data

US 2020/0028364 A1    Jan. 23, 2020

Related U.S. Application Data

(63) Continuation of application No. 15/865,736, filed on Jan. 9, 2018, now Pat. No. 10,367,356, which is a
(Continued)

(30) Foreign Application Priority Data

Apr. 13, 2013    (AU) ................................ 2013901278

(51) Int. Cl.
   *H02J 3/38*    (2006.01)
   *H02J 3/46*    (2006.01)
   *G01R 21/133*  (2006.01)
(52) U.S. Cl.
   CPC ................ *H02J 3/383* (2013.01); *H02J 3/46* (2013.01); *G01R 21/133* (2013.01); *Y02E 10/56* (2013.01)

(58) Field of Classification Search
   None
   See application file for complete search history.

(56) References Cited

U.S. PATENT DOCUMENTS 7,248,490 B2    7/2007   Olsen et al.
8,219,259 B2    7/2012   Haugh
(Continued)

FOREIGN PATENT DOCUMENTS

CN    102355004 A    2/2012
CN    101831995 A    9/2019
(Continued)

OTHER PUBLICATIONS

Apr. 24, 2018 Office Action issued in Australian Patent Application No. 2018100145.
(Continued)

*Primary Examiner* — Jeffery S Zweizig
(74) *Attorney, Agent, or Firm* — Dinsmore & Shohl LLP

(57) ABSTRACT

An inverter energy system supplies power to a site. The inverter energy system comprises a number of solar strings, each solar string including a solar panel(s) as a renewable energy source and an inverter. The inverter energy system is connected to a mains power supply (grid) and to a site load (sub circuits). The forward or reverse power flow into or out of the mains power supply is monitored at a monitoring point at the site. A rate limit is set for power flow into and/or or out of the mains power supply. The supply of power from the inverter energy system is controlled so that the power flow into or out of the mains power supply is within the set rate limit.

17 Claims, 31 Drawing Sheets

Related U.S. Application Data continuation of application No. 14/784,119, filed as application No. PCT/AU2014/000425 on Apr. 14, 2014, now Pat. No. 9,906,037.

(56) References Cited

U.S. PATENT DOCUMENTS

| | | |
|---|---|---|
| 8,552,587 B2 | 10/2013 | Tyagi et al. |
| 8,581,441 B2 | 11/2013 | Rotzoll et al. |
| 8,618,692 B2 | 12/2013 | Adest et al. |
| 8,666,561 B2 | 3/2014 | Fornage et al. |
| 8,780,592 B1 | 7/2014 | Jones et al. |
| 2007/0133241 A1 | 6/2007 | Mumtaz et al. |
| 2009/0000654 A1 | 1/2009 | Rotzoll et al. |
| 2009/0200994 A1 | 8/2009 | Fornage |
| 2010/0114397 A1 | 5/2010 | Cardinal et al. |
| 2010/0312412 A1 | 12/2010 | Haugh |
| 2011/0077786 A1 | 3/2011 | Vaidyanathan |
| 2011/0115292 A1 | 5/2011 | Yoneda et al. |
| 2011/0153098 A1 | 6/2011 | Tomita et al. |
| 2013/0229059 A1 | 9/2013 | Baba et al. |

FOREIGN PATENT DOCUMENTS

| | | |
|---|---|---|
| DE | 102008057563 A1 | 9/2010 |
| DE | 102011089588 A1 | 11/2012 |
| JP | 2011-160606 A | 8/2011 |
| JP | 2012-130096 A | 7/2012 |
| JP | 2012-175795 A | 9/2012 |
| JP | 2498364 A | 9/2012 |
| WO | 2013/013174 A2 | 1/2013 |

OTHER PUBLICATIONS

Sep. 22, 2017 Office Action issued in New Zealand Patent Application No. 714122.

Sinha, N.K.; "Control Systems;" CBS College Publishing; 1986; ISBN 0-03-910743-4; pp. 1-4.

Aug. 8, 2014 Written Opinion issued in International Patent Application No. PCT/AU2014/000425.

Aug. 8, 2014 Search Report issued in International Patent Application No. PCT/AU2014/000425.

Feb. 14, 2017 Examination Report issued in Australian Patent Application No. 2016101834.

Jan. 24, 2017 Office Action issued in Chinese Patent Application No. 201480033706.6.

Jun. 16, 2016 Search Report issued in Singapore Patent Application No. 11201508487X.

Oct. 21, 2016 Written Opinion issued in Singapore Patent Application No. 11201508487X.

Coddington et al; "Photovoltaic Systems Interconnected onto Secondary Network Distribution Systems—Success Stories;" National Renewable Energy Laboratory; Technical Report, Apr. 1, 2009; 55 pp.

Hatta et al; "Study of Energy Management for Decreasing Reverse Power Flow from Photovoltaic Power Systems;" EEE PES/IAS Conference on Sustainable Alternative Energy; Jan. 1, 2009; pp. 1-5.

Aug. 16, 2017 Examination Report issued in Australian Patent Application No. 2014252704.

Aug. 9, 2017 Examination Report issued in Australian Patent No. 201601834.

Jan. 3, 2017 Search Report issued in European Patent Application No. 14782917.0.

to operate properly, including for example during a black-out event.

ENERGY GENERATION LOAD COMPENSATION

CROSS-REFERENCE TO RELATED APPLICATIONS

This is a Continuation of U.S. patent application Ser. No. 15/865,736 filed Jan. 9, 2018, which is a Continuation of U.S. patent application Ser. No. 14/784,119 filed Oct. 13, 2015 and issued as U.S. Pat. No. 9,906,037, which in turn is a National Phase of Application No. PCT/AU2014/000425 filed Apr. 14, 2014, which claims the benefit of Australian Patent Application No. 2013901278 filed Apr. 13, 2013, the contents of which are each hereby incorporated by reference herein in their entirety.

FIELD OF THE INVENTION

This invention relates in general to renewable energy generation within a utility grid. In particular, the present invention relates to a system, method and apparatus for renewable energy generation for the purpose of compensating the load from the utility grid and providing a network protection device which incorporates isolation from the utility grid and the renewable energy system.

BACKGROUND OF THE INVENTION

It should be noted that reference to the prior art herein is not to be taken as an acknowledgement that such prior art constitutes common general knowledge in the art.

Electricity or power is an essential part of modern life. In residences, in businesses, in institutions and in other locations, consumers use electricity in a variety of ways. Utilities deliver power generated by power plants through a network of transmission and distribution lines. This network is hereinafter referred to as the "power transmission and distribution grid," "the electric grid," "the grid" or "power grid."

Renewable energy is a practical and environmentally conscious alternative to traditional utility production. One of the more desirable renewable sources is solar power. Solar equipment consumes no fossil fuels and generates no air pollutants. The use of solar power is generally regarded as environmentally safe. Utilities in most countries are required (or voluntarily do so) for public policy reasons to credit or actually buy excess power generated by a solar generating system from a consumer. In addition to these benefits, solar systems can provide customers with significant cost savings in the long run. As an incentive to install solar systems, government entities may provide rebates or tax deductions to customers who purchase and install solar systems.

Such programs have met with limited success for various reasons most particularly the inability of some types of energy users to curtail energy use and the lack of real-time information regarding the immediate cost of energy usage.

The use of power generated from renewable energy resources is rapidly increasing, attention is being focused on systems and methods in which such power is produced, transmitted, delivered, and consumed. The technology used in developing renewable energy resources, electricity grids and current energy infrastructure suffer from many limitations.

Furthermore, as the demand for such power increases, and regulatory requirements for use of "green" resources become more prominent there is a growing need to provide a useful alternative or at least an improvement on what has previously been done.

In recent years, concerns have been raised that high demand for electricity is taxing the capacity of existing electricity generating plants.

Furthermore, concerns regarding the availability and environmental safety of fossil and nuclear fuel are being raised. As a result of the above factors, the price of electricity has been on a path of steady increase. Likewise, the electrical utility industry has for some time laboured under the problem of supplying cost effective power to comply with system peak-demand period requirements.

Renewable energy systems have been used with gaining popularity to resolve at least partially the peak-demand issue of the power grid. For example, a solar power system may convert generated DC electricity from solar panels into AC electricity and be used to power electrical appliances. The generated DC power is also converted to AC power by an inverter so that power grid companies may purchase AC power produced.

These systems are typically being developed for the home or business which remains connected to the main electricity grid, so any electricity that your system generates above what you use is fed back into the grid. When you require more electricity than you are producing, your system imports it from the grid automatically. Your electricity bill is calculated as the difference between the amount of electricity you export from your renewable energy system and the amount you import from the grid—you only pay for the electricity you use that is over and above what your renewable energy system produces.

At present, feed-in regulations or tariffs for renewable energy exist in over 40 countries, states or provinces internationally, all involving the payment of a premium for the electricity fed into the grid from a variety of renewable energy sources. These feed in tariffs (FiT) are typically applied in two forms. A first form is a gross FiT—whereby all electricity generated from a renewable source is purchased from the generator at a generous price, with the generator buying-back any electricity they need to use from the grid. The second form of FiT is a net FiT—whereby only unused or surplus electricity is purchased from the generator.

In order to recover some of the expenses out laid in converting to a grid fed renewable energy system users are looking for ways to maximise the FiT benefit. Presently, consumers are maximising their financial benefit by improving the energy efficiency of their home to export more electricity to the grid. This could be achieved by reducing standby power consumption, switching to controlled load tariffs and minimising the use of energy intensive appliances such as air-conditioners. The fact that the FiT payment levels are performance-based puts the incentive on producers to maximise the overall output and efficiency of their system.

The problems with current domestic solar grid feed systems is that they are creating problems on the energy network regarding power quality and voltage spikes/abnormalities which requires expensive equipment to rectify it.

Furthermore domestic solar grid feed systems are reducing the amount of power that can be sold by the generators and distributors, yet the actual amount of energy produced by the generators has to remain constant due to the fluctuating nature of small scale solar energy production. This means that the power generation companies and distributors still have the same or higher network costs, yet their income from selling and distributing the power has reduced. Thus there have been increases seen in electricity bills for items such as service charges.

Clearly it would be advantageous if a renewable energy generation load compensation system, method and apparatus could be devised that helped to at least ameliorate some of the shortcomings described above. In particular, it would be beneficial for a renewable energy generation load compensation system to improve on these deficiencies in renewable energy generation for the purpose of compensating the load from the utility grid, or to at least provide a useful alternative.

SUMMARY OF THE INVENTION

In accordance with a first aspect of the invention, there is provided a method of controlling an inverter energy system supplying power to a site, the inverter energy system connected to a mains power supply and to a site load, the method including monitoring, at a monitoring point at the site, the forward or reverse power flow into or out of the mains power supply;

setting a rate limit for power flow into or out of the mains power supply; and controlling the supply of power from the inverter energy system so that the power flow into or out of the mains power supply is controlled to be within the rate limit.

The rate limit is preferably a set power consumption limit of power flow out of the mains power supply in a forward direction. The rate limit may include an upper limit and a lower limit.

The inverter energy system may include two or more inverter energy strings, the upper power consumption limit preferably selected to be at or larger than the expected maximum power supply from an inverter of one of the inverter energy strings.

The rate limit may be a set power export upper limit of the power flow into the mains power supply.

The set power consumption lower limit may be at or close to 0 kW, so as to approximately balance the rate of supply of power from the inverter energy system with the rate of power use by the site load.

The supply of energy from the inverter energy system may include mechanically or electrically isolating an inverter of one of a number of inverter energy strings of the renewable energy source.

The inverter energy system preferably includes two or more inverters and control of the supply of energy from the inverter energy source includes mechanically or electrically isolating one or more of the inverters. A first inverter of the inverter energy system may be isolated upon reverse power flow or a fault condition being detected at the monitoring point. A further inverter of the inverter energy system may be isolated upon a fault condition being detected at the monitoring point, but the further inverter is not isolated due to reverse power flow being detected at the monitoring point.

Control of the supply of energy from the inverters of the inverter energy system may be electronic digital control of the power output from one or more of the inverters.

Monitoring the forward or reverse power flow into or out of the mains power supply may include sensing the voltage and/or a current at the monitoring point to sense the load on the mains power supply.

The inverter energy system preferably includes two or more inverter energy strings, each inverter energy string comprising a supply of renewable energy connected to an inverter. The supply of renewable energy may be a photovoltaic/solar panel or an array of photovoltaic/solar panels.

The inverter energy system may include a first inverter energy string and a further inverter energy string, the method including when power is in the forward direction connecting said further inverter energy string to compensate for the usage of load from the mains power supply and when forward power or load decreases isolating said further inverter energy string to prevent over generation from the further energy string above the rate limit.

In accordance with a second aspect, the present invention provides a controllable switch connectable to:

a voltage and/or a current sensing devices to sense the load on a mains power supply; and an inverter energy system in the form of a renewable energy source comprising: a first series comprising at least one renewable energy supply connected to a first inverter; at least one further series comprising at least one further renewable energy supply connected to a further inverter;

wherein the controllable switch is operable to monitor, at a monitoring point at the site, the forward or reverse power flow into or out of the mains power supply, and includes a microprocessor programmed for setting a rate limit for power flow into or out of the mains power supply, the controllable switch configured to be connected to the inverter energy system so that the controllable switch is operable to vary the supply of power from the inverter energy system so that the power flow into or out of the mains power supply is controlled to be within the rate limit.

The microprocessor is preferably programmed to control the energising and isolation of each series via contactors; and wherein said first series and inverter are sized and connected to export renewable energy to the mains power supply, and said further series and inverters are switched depending on the load or consumption on the mains power supply reaching a set rate limit for power flow into or out of the mains power supply.

The microprocessor preferably includes a communications port for communicating with the inverters to ramp the inverters up or down so that the power flow into or out of the mains power supply is controlled to be within the rate limit.

In accordance with a third aspect, the present invention provides a renewable energy generation load compensation system comprising: a mains power supply; an auxiliary energy source in the form of a renewable energy source comprising: a first series comprising at least one renewable energy supply connected to a first inverter; at least one further series comprising at least one further renewable energy supply connected to a further inverter; and a contactor connected to each said inverter to electrically isolate and connect each said series to and from the system; a controllable switch comprising: a voltage and/or a current sensing devices to sense the load on the mains power supply; an energising means connected to each said contactor to isolate and energise each said series; and a microprocessor programmable to control the energising and isolation of each series; a site power supply network adapted to be connected to either the mains power supply or the renewable energy source; and wherein said first series and inverter are sized and connected to export renewable energy to the mains power supply, and said further series and inverters are switched depending on the load or consumption on the mains power supply.

In accordance with a fourth aspect, the present invention provides a renewable energy generation load compensation system comprising: a mains power supply; an inverter energy system in the form of a renewable energy source comprising: a first series comprising at least one renewable energy supply connected to a first inverter; at least one further series comprising at least one further renewable energy supply connected to a further inverter; and a contactor connected to each said inverter to electrically isolate and connect each said series to and from the system; a controllable switch comprising: a voltage and/or a current sensing devices to sense the load on the mains power supply; an energising means connected to each said contactor to isolate and energise each said series; and a microprocessor programmable to control the energising and isolation of each series; a site power supply network adapted to be connected to either the mains power supply or the renewable energy source; and wherein said first series and inverter are sized and connected to export renewable energy to the mains power supply, and said further series and inverters are switched depending on the load or consumption on the mains power supply reaching a set rate limit for power flow into or out of the mains power supply.

In accordance with a fifth aspect, the present invention provides a renewable energy generation load compensation system comprising: a mains power supply; an inverter energy system in the form of a renewable energy source comprising: a first series comprising at least one renewable energy supply connected to a first inverter; at least one further series comprising at least one further renewable energy supply connected to a further inverter; a controllable switch comprising: a voltage and/or a current sensing devices to sense the load on the mains power supply; a communications link connected to each said inverter; and a microprocessor programmable to control the power output from each inverter via the communications link; a site power supply network adapted to be connected to either the mains power supply or the renewable energy source; and wherein said first series and inverter are sized and connected to export renewable energy to the mains power supply, and the power output from said further series and inverters is varied depending on the load or consumption on the mains power supply reaching a set rate limit for power flow into or out of the mains power supply.

Preferably, the size of the first series and inverter may be determined by the requisite feed in tariff. The system may be connected to any single, two or three phase mains power supply.

Preferably, the controllable switch may be designed to continuously measure and monitor both forward and reverse direction of power flow in the mains power supply.

When power is in the forward direction the controllable switch may connect said further series to compensate for the usage of load from the mains power supply. When forward power or load decreases the controllable switch may isolate said further series to prevent over generation from the renewable energy source.

Preferably, the system may further comprise any one or more of the following protection devices: (i) over voltage protection; (ii) under voltage protection; (iii) over frequency protection; (iv) under frequency protection; (v) differential frequency protection between the phases; (vi) phase failure protection; (vii) rate of change of frequency protection; (viii) voltage vector shift protection; or (vii) reverse power flow protection. Should any one of the protection devices be energised the system may isolate and protect the mains power supply. The microprocessor of the system may be programmable to energise or de-energise the protection devices. The microprocessor may include the protection devices.

Preferably, the system may further comprise an event logger to monitor and analyse each phase of the mains power supply.

Preferably, the system may further comprise the event logger monitoring and analysing each phase of the renewable energy generation supply.

Preferably, the controllable switch may be programmed to allow the requisite feed in tariff to be exported with all series connected to the mains power supply.

Preferably, the system may automatically disconnect from the mains power supply in order to protect the mains power supply from an islanding fault.

Preferably, the system may further comprise a grid load measurement module which measures the grid load of the mains power supply by measuring the frequency of the mains power supply.

Preferably, the renewable energy source may be any one or more of the following: (i) a solar energy source comprising at least one photovoltaic panel; (ii) a wind energy source comprising at least one wind turbine; or (iii) a hydro energy source comprising a water source using the gravitational force of falling or flowing water.

Preferably, the system may further comprise a data network for transferring information between the controllable switch, the mains power supply, the renewable energy source, and the power supply network.

According to a further aspect, the present invention provides a method comprising managing renewable energy generation load compensation by linking together a mains power supply, a renewable energy source, and a site power supply network through a controllable switch; said method comprising the steps of: (i) monitoring the load on the mains power supply; (ii) connecting a first series and an inverter to export energy to the mains power supply; (iii) sensing the load is in the forward direction connecting further series and inverters to compensate the usage of the load in the mains power supply; (iv) sensing a decrease in the load or forward power and isolating the further series to prevent over generation from the renewable energy source. Preferably, the method may further comprise any one of the features of the first aspect.

According to a still further aspect, the present invention provides a renewable energy generation load compensating apparatus comprising a non-transitory computer readable media which stores computer instructions; and computer instructions stored on said media accessibly to a microprocessor of a controllable switch device which links together a mains power supply, a renewable energy source, and a site power supply network through the controllable switch, the instructions when executed on the microprocessor: (i) monitoring the load on the mains power supply; (ii) connecting a first series and an inverter to export energy to the mains power supply; (iii) sensing the load is in the forward direction connecting further series and inverters to compensate the usage of the load in the mains power supply; and (iv) sensing a decrease in the load or forward power and isolating the further series to prevent over generation from the renewable energy source.

According to a still further aspect, the present invention provides a system for managing renewable energy generation load compensation comprising: a mains power supply; a master controllable switch and at least one slave controllable switch; at least one dwelling comprising said at least one slave controllable switch, said at least one dwelling comprising: a renewable energy source comprising at least one renewable energy source, at least one inverter, a contactor connected to each said inverter to isolate and connect each said dwelling to and from the system, and a site supply network connected to either the renewable energy source or the mains power supply; wherein said master controllable switch controls the system by: (i) monitoring the load on the mains power supply; (ii) connecting at least one dwelling to export energy to the mains power supply; (iii) sensing the load is in the forward direction; iv) connecting a further dwelling to compensate the usage of the load in the mains power supply; (v) sensing a decrease in the load or forward power and isolating the further dwelling to prevent over generation from the renewable energy source.

Preferably, each master controllable switch and slave controllable switch may further comprise: a voltage and/or a current sensing device(s) to sense the load on the mains power supply; an energising coil connected to each said contactor in each dwelling to isolate and energise each said dwelling; and a microprocessor programmable to control the energising and isolation of each dwelling.

Preferably, the at least one dwelling connected to export energy from the renewable energy source to the mains power supply may be rated and size determined by the requisite feed in tariff. The system may be connected to any single, two or three phase mains power supply. The master controllable switch may be designed to continuously measure and monitor both forward and reverse direction of power flow in the mains power supply. The renewable energy source may be any one or more of the following: (i) a solar energy source comprising at least one photovoltaic panel; (ii) a wind energy source comprising at least one wind turbine; or (iii) a hydro energy source comprising a water source using the gravitational force of falling or flowing water.

Preferably, the system may further comprise a data network for transferring information between the master controllable switch, the slave controllable switch, the mains power supply, the renewable energy source, and the site power supply network.

Preferably, the system may further comprise a multi-unit installation comprising two or more dwellings. Each dwelling may comprise a slave controllable switch and the multi-unit installation has the master controllable switch to continuously measure and monitor both forward and reverse direction of power flow in the mains power supply for the multi-unit installation.

According to a still further aspect, the present invention provides a renewable energy generation load compensation system comprising: a mains power supply; a renewable energy source with at least one renewable energy supply; a site power supply network adapted to be connected to either the mains power supply or the renewable energy source; an inverter connected to each said renewable energy source, said inverter comprising: a contactor connected to each said inverter to electrically isolate and connect each said renewable energy supply to and from the system; a controllable switch comprising: a voltage and/or a current sensing devices to sense the load on the mains power supply; an energising coil connected to each said contactor to isolate and energise each said renewable energy supply; and a microprocessor programmable to control the energising and isolation of each said renewable energy supply; and wherein at least one of said renewable energy supplies is sized and connected to export renewable energy to the mains power supply, and said further renewable energy supplies are switched depending on the load or consumption on the mains power supply.

Preferably the system may be connected to any single, two or three phase mains power supply. The inverter and said controllable switch may be designed to continuously measure and monitor both forward and reverse direction of power flow in the mains power supply. The renewable energy source may be any one or more of the following: (i) a solar energy source comprising at least one photovoltaic panel; (ii) a wind energy source comprising at least one wind turbine; or (iii) a hydro energy source comprising a water source using the gravitational force of falling or flowing water.

According to a still further aspect, the present invention provides an integrated renewable energy system, comprising: a mains power supply; a renewable energy source with at least one renewable energy supply and an inverter connected to the, or each, renewable energy supply; a site power supply network adapted to be connected to either the mains power supply or the renewable energy source; a load compensation device comprising: a contactor connected to each said inverter to electrically isolate and connect each said renewable energy supply to and from the system; a controllable switch comprising: a voltage and/or a current sensing devices to sense the load on the mains power supply; an energising coil connected to each said contactor to isolate and energise each said renewable energy supply; and a microprocessor programmable to control the energising and isolation of each said renewable energy supply; and wherein at least one of said renewable energy supplies is sized and connected to export renewable energy to the mains power supply, and said further renewable energy supplies are switched depending on the load or consumption on the mains power supply.

Preferably, the load compensation device may be retrofitted to any type or size inverter to facilitate the load compensation on the mains power supply.

The load compensation device may be part of the inverter for the load compensation on the mains supply.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to the invention, but are for explanation and understanding only.

DETAILED DESCRIPTION OF THE PREFERRED EMBODIMENTS

Figure 1:
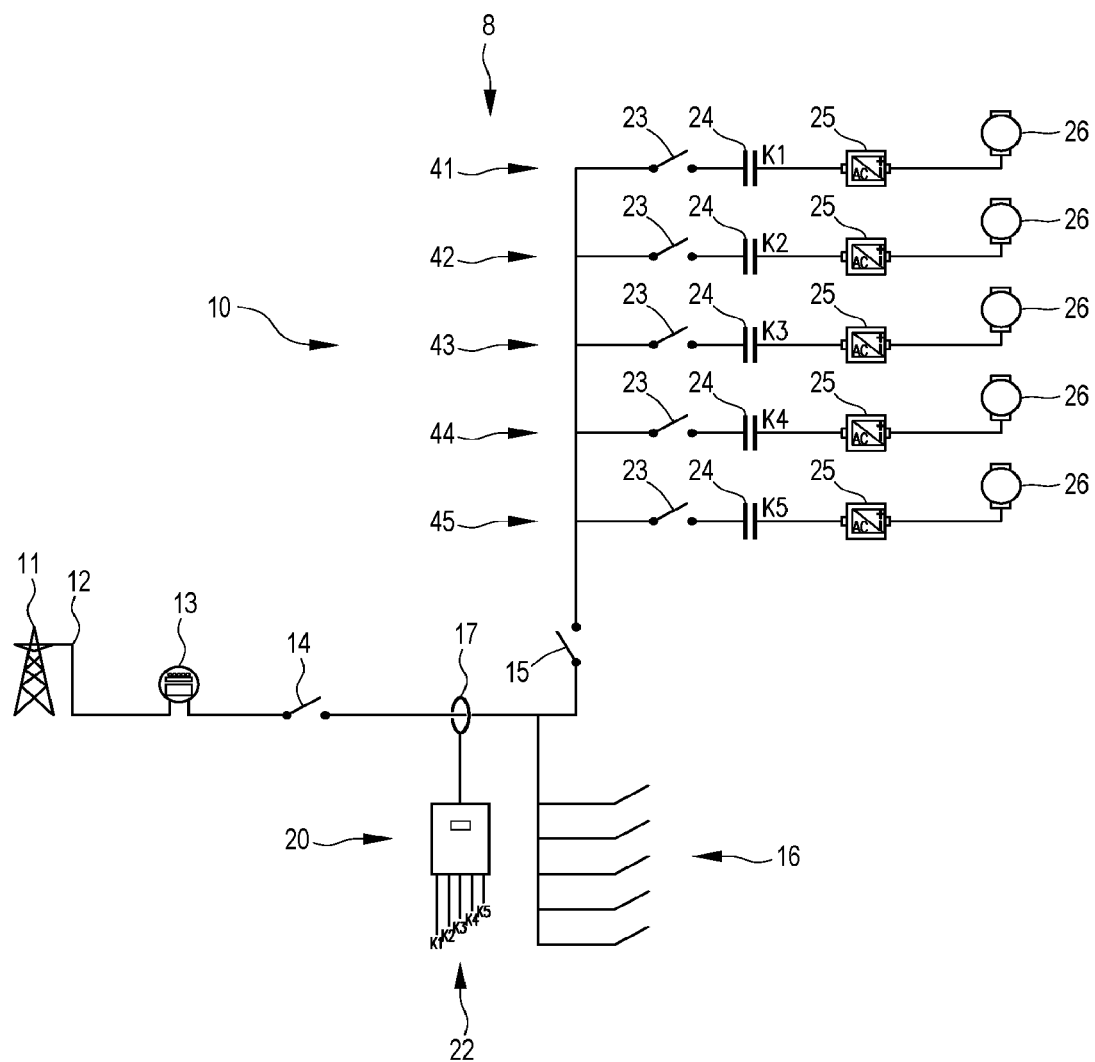
FIG. 1 is a single line drawing for an energy load compensation system in accordance with the present invention.

The following description, given by way of example only, is described in order to provide a more precise understanding of the subject matter of a preferred embodiment or embodiments.

Described embodiments relate generally to methods, systems and apparatus for an energy generation load compensation and computer readable storage configured to control the performance of such methods, systems and apparatus. The energy load compensation system is typically used for Inverter Energy Systems, such as renewable energy solar photovoltaic fed grid installations, for the purpose of compensating the load from the mains supply grid and the described embodiments are particularly suited to such purposes. Embodiments are not, however, limited to such use. For example, the Inverter Energy System at site may be an array of photovoltaic panels and inverter(s) as discussed, wind turbine(s) and inverter(s), hydroelectric turbine(s) and inverter(s), or any other energy source and inverter combination.

Photovoltaics (PV) is a method of generating electrical power by converting solar radiation into direct current electricity using semiconductors that exhibit the photovoltaic effect. Photovoltaic power generation employs solar panels 26 composed of a number of solar cells containing a photovoltaic material. An Inverter Energy System in the form of a PV system 8 comprises a number of solar strings 41, 42, 43, 44 and 45. Each solar string (or series) comprises one or more photovoltaic (PV) panels 26 as a renewable energy source, a DC/AC power converter or inverter 25, electrical interconnections, and associated switches and contactors 23, 24. The electricity generated can be either stored, used directly (island/standalone plant), or fed into the electricity grid 11, or combined with one or many site renewable energy generators to feed into a small grid.

Renewable energy is energy that comes from resources which are continually replenished such as sunlight, wind, rain, tides, waves and geothermal heat. Therefore the present invention is not limited to any particular renewable energy. For example, in addition to the solar systems, wind turbines have also been employed to provide clean or renewable energy. The wind turbine generates an AC power from the kinetic energy of the wind through a system comprising a rotator, a gearbox and a generator. The AC power is rectified into a DC power and is further converted into AC power with the same frequency as the AC power from the power grid. Likewise, hydroelectricity is the term referring to electricity generated by hydropower; the production of electrical power through the use of the gravitational force of falling or flowing water.

The following description will be described with reference to solar energy and the use of photovoltaic panels however, the production of renewable energy is not limited to only such use. Likewise, isolation referred to in the following paragraphs refers to both electrical and mechanical isolation.

Therefore isolation for both the mains grid and the renewable energy supply may incorporate both mechanical and electrical isolation in order to protect both the main and the renewable energy supplies and their associated components.

Figure 2:
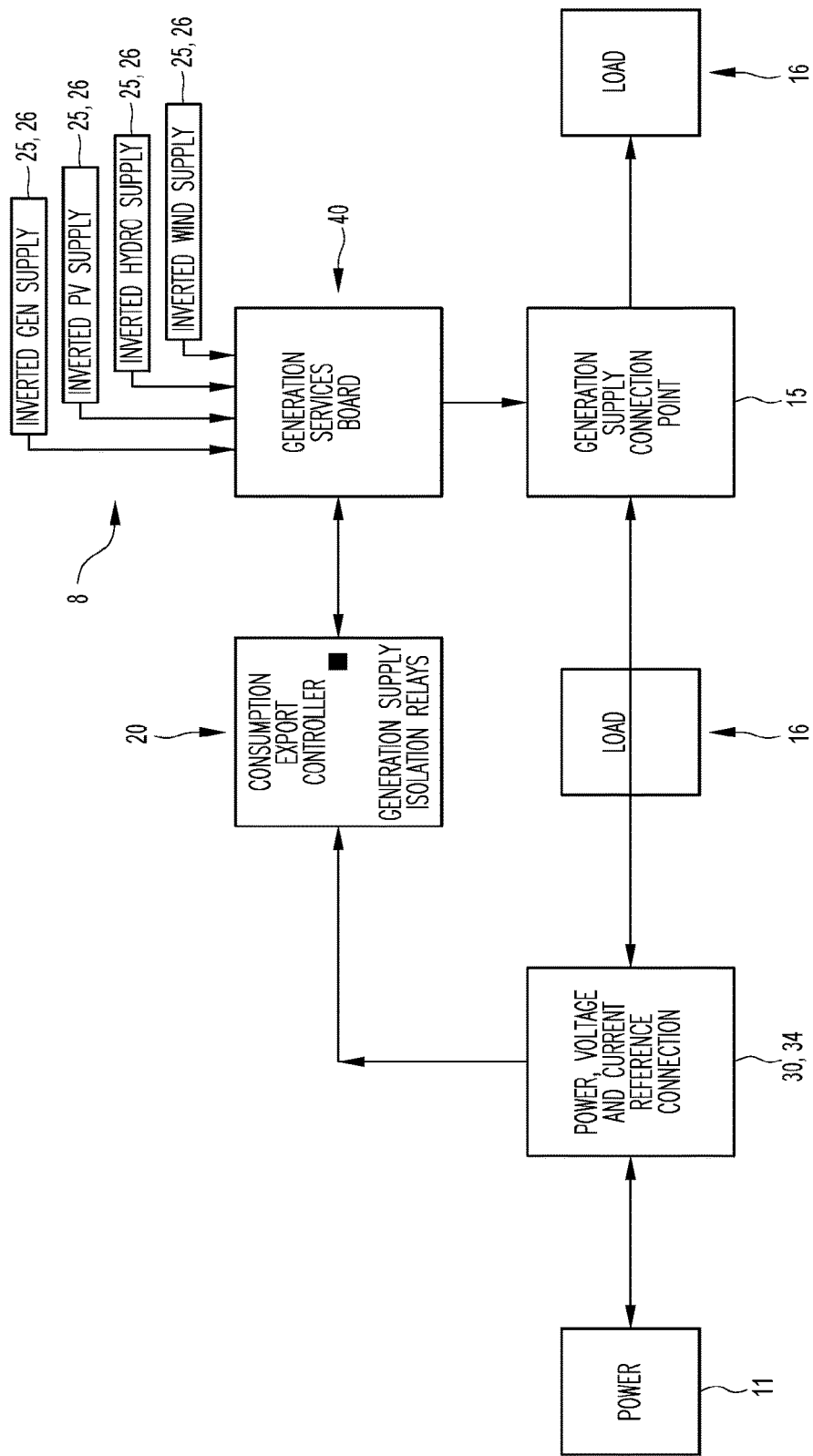
FIG. 2 is a block diagram of the energy load compensation system of FIG. 1.

FIGS. 1 and 2 show a schematic diagram and a block diagram of a renewable energy load compensation system 10 in accordance with a first embodiment of the present invention.

Figure 3:
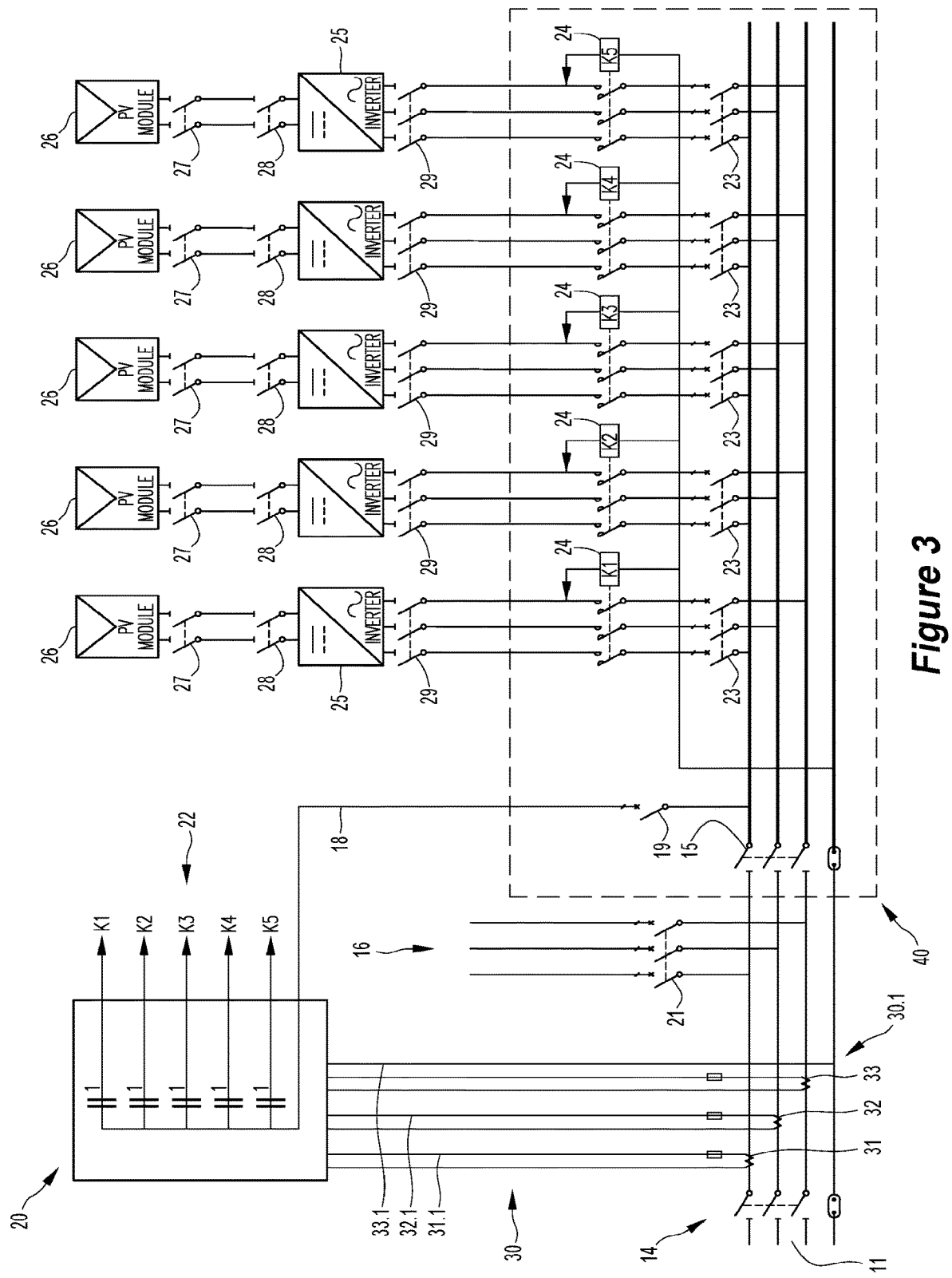
FIG. 3 is a schematic view of a three phase energy load compensation system in accordance with the present invention.

FIG. 1 shows a single line drawing of the mains power supply 11 and FIG. 2 shows a block diagram of the main components in the load compensation system 10. FIG. 3 shows a schematic diagram of a three phase mains power supply 11 in accordance with a first embodiment of the present invention. In order to provide the compensation for the load or sub circuits 16 on the mains power supply 11 the present invention incorporates a controllable switch in the form of load compensation device 20 and associated circuitry. Reference to a "load compensation device" includes reference to Consumption Export Controller, Load Compensation Device or Export Control Device, Network Protection Relay and Reverse Power Relay.

A mains power supply 11 provides mains electricity in the form of general-purpose alternating-current (AC) electric power supply. Worldwide, many different mains power systems are found for the operation of household and light commercial electrical appliances and lighting. The main differences between the systems are primarily characterised by their voltage, frequency, plugs and sockets (receptacles or outlets), and earthing system (grounding).

Auxiliary power supply to the site comprises an Inverter Energy System in the form of the PV system 8. The PV system 8 includes five inverter energy strings, each inverter energy string comprising a supply of renewable energy 26 connected to an inverter 25, in the form of five solar strings 41, 42, 43, 44, 45.

The mains power or grid supply 11 is fed via transmission lines 12 to a site. The site may be a domestic residence or dwelling, factory or shop.

An electricity meter or energy meter 13 is a device that measures the amount of electric energy consumed by the site. Incorporating renewable energy generating equipment at the site, means a customer may be generating more electricity than required for his own use, the surplus may be exported back to the mains power grid 11. Customers that generate back into the "grid" usually must have special equipment and safety devices to protect the grid components (as well as the customer's own) in case of faults (electrical short circuits) or maintenance of the grid (say voltage potential on a downed line going into an exporting customers facility).

Power export metering 13 provides metering which is capable of separately measuring imported and exported energy as used or required.

Typically these meters 13 are a bi-directional import/export meter which can measure both how much electricity is used at site, and how much electricity gets fed back into the grid 11 from the solar power system 8. A main switch 14 isolates the main power grid from the site sub circuits 16. Likewise, the renewable energy main switch 15 isolates the PV system 8 from the mains power supply 11 and the sub circuits 16 of the site.

The renewable energy load compensation device 20 is designed to continuously measure and monitor both forward and reverse direction and value of power flow in the mains power supply 11 to and from the site. The power flow value and direction is measured via a current transformer 17 and/or voltage transformer 17. Alternatively the power flow can be measured directly by hard reference connection to the power lines from the main switch 14 to the site sub circuits 16. The current and/or voltage transformer 17 may similarly be a current and/or voltage transducer(s).

When power is in the forward direction energy flows from the grid supply 11 to the site and is consumed by the site sub circuits 16 (consumption). When power is in the forward direction, the load compensation device 20 will first connect solar string 41 with the inverter 25 and solar array 26 to feed the sub-circuits 16.

If further forward power or consumption is generated by sub circuits 16, for example when the load from the sub circuits 16 increase due to increased power use, load compensation device 20 will energise further solar strings 42, 43, 44, 45 to compensate for the increased of load and additional power use from the mains power supply 11. Likewise, when forward power or load decreases, for example when the load from the sub circuits 16 decrease due to decreased power use, the load compensation device 20 will isolate the further solar strings 42, 43, 44, 45 to prevent over generation from the Inverter Energy System 8. If no load is sensed by the load compensation device 20, and the system is configured for zero power export, the first solar string 41 will also be isolated. Configuration of the load compensation device for zero power export includes setting a power consumption lower limit at or slightly over 0 kW. This means that the load compensation device 20 will control the PV system 8 not to export any net energy to the mains power supply. The lower power consumption limit may be set slightly over 0 kW, for example 0.1 kW, to take into account a margin of error in measuring the flow of power, thereby to err on the side of caution not to export any energy into the mains power supply 11.

As an example of the above, the power consumption lower limit is set to 0.1 kW, the load by the sub circuits is a constant 11 kW (hypothetical) and the inverters 25 are rated at 5 kW. When it is dark (at night) there will be little or no power generation from the PV system 8, so all inverters 25 will be connected (contactors closed). As the sun rises power output from the PV system 8 will rise. Just before the power output from the PV system matches the 11 kW load (when the consumption lower limit of 0.1 kW is reached), the load compensation device 20 will isolate one of the inverters 25 (contactor K5 open) to isolate solar string 45 and thus step the power generation from the PV system 8 down. If the power from the PV system 8 need to be stepped down again then the next solar string will be isolated. If all inverters are producing 4 kW, for example when it is sunny at midday, then only two solar strings (41, 42) would be connected (8 kW from the PV system 8 consumed by the 11 KW site load) and the remaining three solar strings (43, 44, 45) isolated. As the sun goes down and the inverters 25 produce less and less, the solar strings 43, 44, 45 are sequentially brought back online without going over the 0.1 kW power consumption lower limit.

Figure 5:
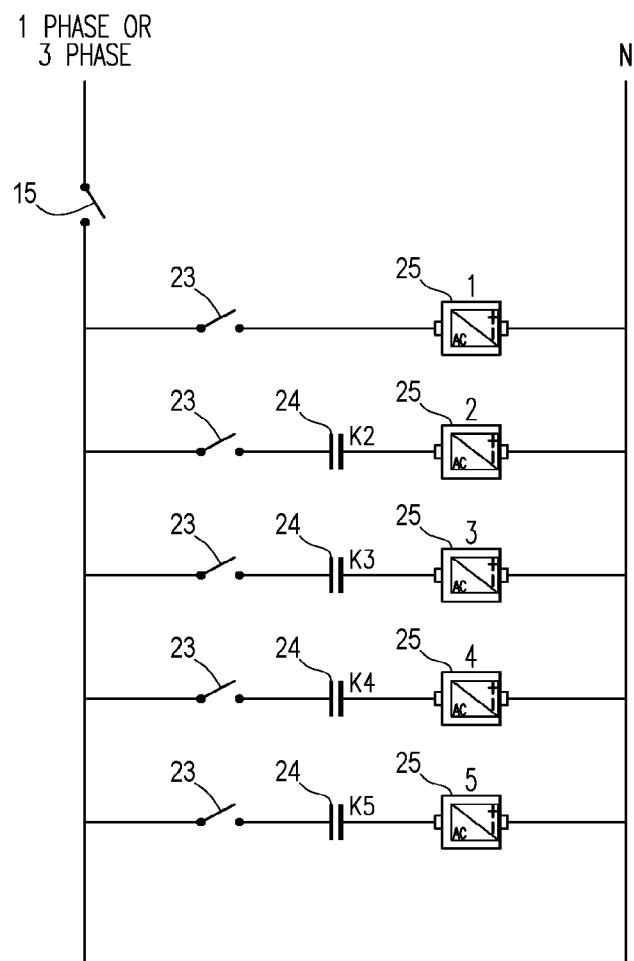
FIG. 5 shows a single line drawing showing the system of FIG. 1 connected with the agreed feed in tariff.

As is shown in FIG. 5, when configured for export of energy to the mains power supply 11, a first solar string 41 does not include contactor K1. If further forward power or consumption is generated by sub circuits 16 load compensation device 20 will energise further solar strings 42, 43, 44, 45 to compensate for the usage of load from the mains power supply 11. Likewise, when forward power or load decreases the load compensation device 20 will isolate the further solar strings 42, 43, 44, 45 to prevent over generation from the renewable energy source 26. If no load is sensed by the load compensation device 20, the first solar string 41 will also be isolated.

In order to isolate and energise the solar strings 41, 42, 43, 44, 45 the renewable energy load compensation system 10 of FIG. 1 uses contactors 24 (K1 to K5) to selectively energise or isolate each solar string. A contactor 24 is an electrically controlled switch used for switching a power circuit. The contactor 24 is controlled by an energising means or circuit 22, with separate circuits 22 used to energise each of the K1 to K5 contactors 24. The generator (renewable energy) services board 40 also incorporates string isolation switches 23 which open should an error condition or protection device energise due to an over or under voltage, current or frequency event occur. The switch 23 will isolate and protect each solar string 41, 42, 43, 44, 45 to protect the inverters 25 and solar array 26. These string isolation switches 23 are circuit breakers, also referred to as AC isolators for the inverter, which will only activate on an over current load/fault.

FIG. 3 shows a detailed schematic drawing of the load compensation system 10 for a three phase mains power supply 11. With any multi-phase system the components are typically the same for each phase and similar to that of a single phase system.

In FIG. 3 the load compensation device 20 shows the sensing of the load using current sensing 30 in the three phases. The monitoring point 30.1 for current sensing 30 is on the load side, of the main switch 14. Current transformers (CT) 31, 32, 33 are used for measurement of electric currents in each of the phases. Voltage reference measurements are taken at the monitoring point 30.1 by voltage monitoring reference lines 31.1, 32.1 and 33.1.

As discussed above the sensing of the load on the mains supply 11 can be performed at the monitoring point 30.1 by either current transformers (or voltage transformers (VT) (also known as potential transformers (PT), which are known as instrument transformers. When current in a circuit is too high to directly apply to measuring instruments, a current transformer produces a reduced current accurately proportional to the current in the circuit, which can be conveniently connected to measuring and recording instruments. A current transformer also isolates the measuring instruments from what may be very high voltage in the monitored circuit.

FIG. 3 also shows a number of circuit breakers 19, 21, 23 used to protect the respective circuits. The circuit breakers 19, 21, 23 are typically an automatically operated electrical switch designed to protect an electrical circuit from damage caused by overload or short circuit. Circuit breaker 19 provides a power input 18 to be fed to the load compensation device 20 to provide AC power when the renewable energy source 26 is connected. Further protection devices 27, 28, and 29 are used to isolate and protect the respective components from the system 10. The protection devices 27, 28 and 29 are isolation switches.

Figure 4:
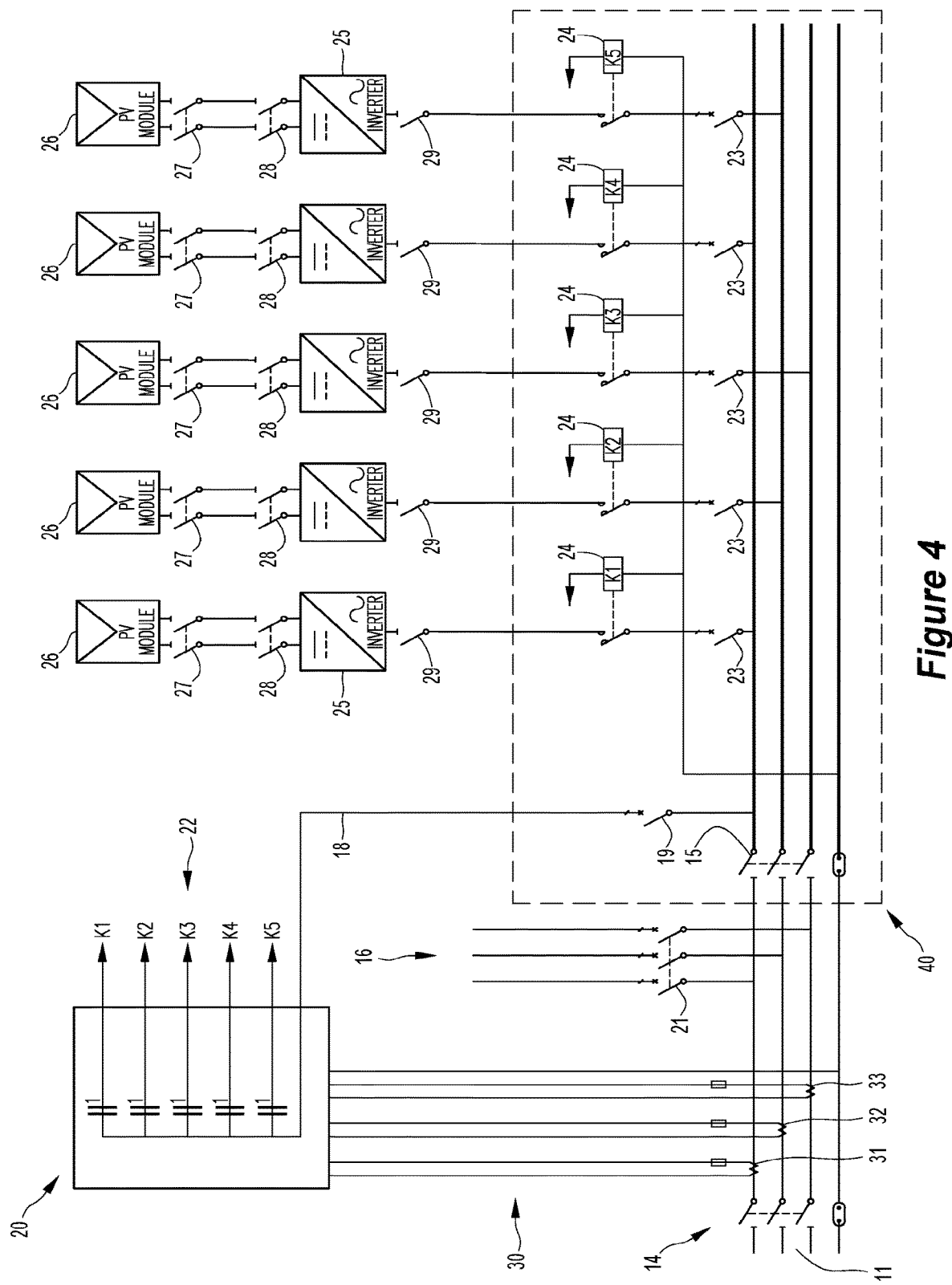
FIG. 4 is a schematic view of the energy load compensation system of FIG. 3 with at least one inverter linked to each phase.

FIG. 4 shows the three phase system of FIG. 3 with inverters 25 on each phase. This provides the added advantage of being able to compensate the load on a single phase without affecting the other two phases. Therefore any one or more of the phases of a multiple phase system can be implemented to compensate for the load on that phase.

FIGS. 5 to 9 show the operation of respective parts of the renewable energy load compensation system 10.

FIG. 5 illustrates the connection of each solar string 41, 42, 43, 44, 45 of the renewable energy source 26 with string 41 connected for export of energy to the mains power supply 11 in line with the agreed feed in tariff for the system 10.

Figure 5A:
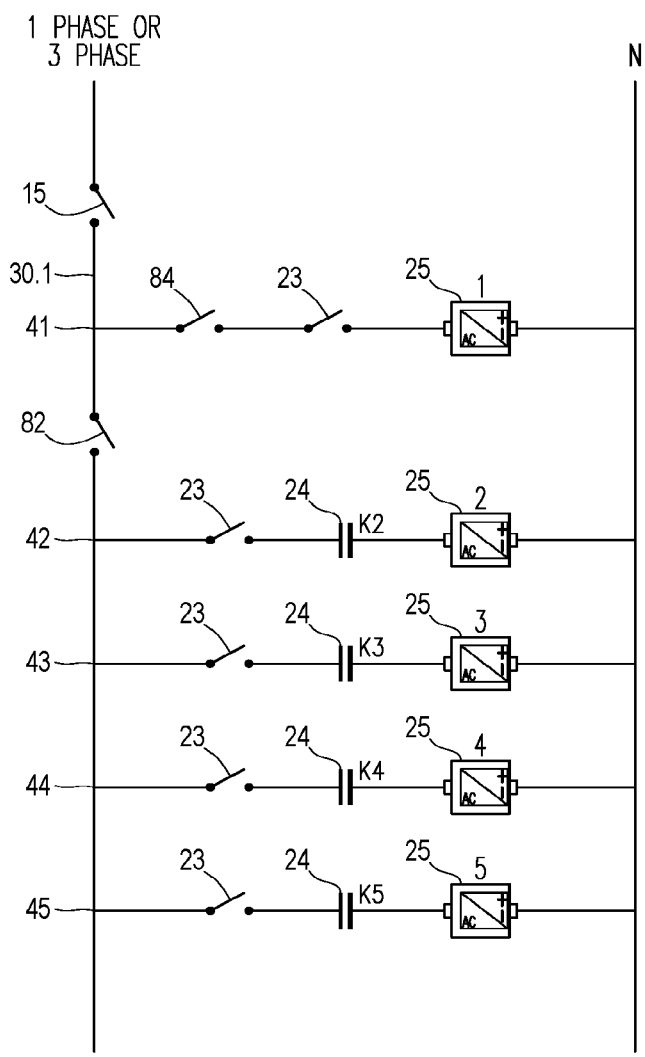
FIG. 5A shows the system of FIG. 5 further including Full and Zero control relays.

FIG. 5A shows the system 10 including a Zero Export contactor 82 and a Full Export contactor 84. The contactors 82, 84 are controlled by the load export device 20.

The Zero Export contactor 82 will be opened by the device 20 when a fault condition is detected, including when export is detected at measuring point 30.1.

The Full Export contactor 84 is a protection device for the export solar string 41. The Full Export contactor 84 will be opened by the device 20 when a fault condition is detected, except for power export. The Full Export contactor 84 does not trip when export is detected at 30.1, as the device 20 still allows export of an agreed feed-in by solar string 41. The first solar string 41 is connected to the generator supply main switch 15 at a connection so that isolation of the further solar strings (42 to 45) by contactor 82 does not isolate the first solar string 41 from the mains supply generator supply switch 15.

Figure 6:
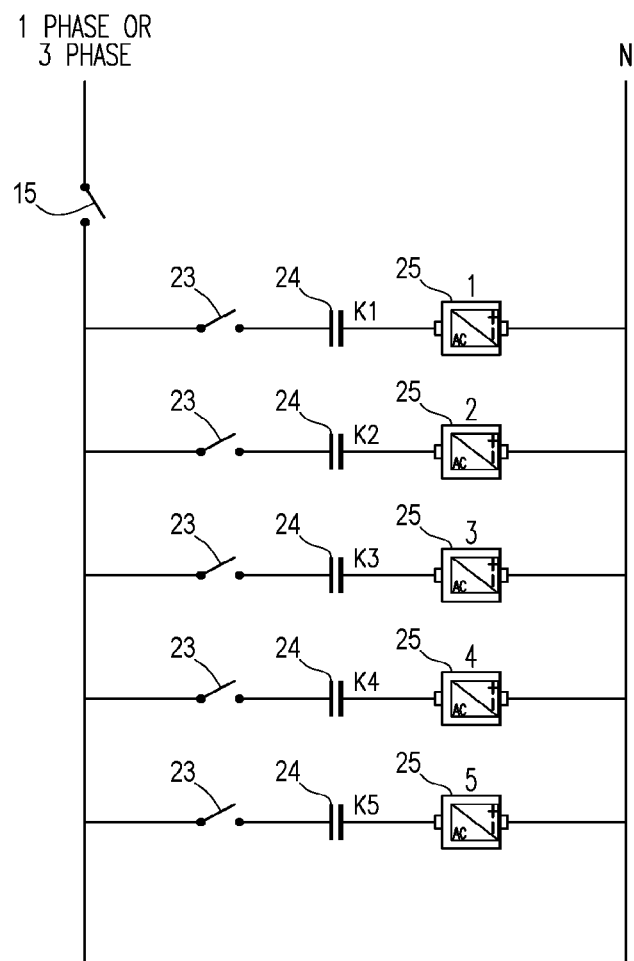
FIG. 6 shows a single line drawing showing the system of FIG. 1 excluding the connection of the agreed feed in tariff.

FIG. 6 shows a similar schematic to FIG. 5, however all inverters 25 are connected through the energising of contactors 24, and therefore there is no export of renewable energy to the mains power supply 11 if the lower consumption limit of the load compensation system 10 is set at 0 kW or more.

Figure 7:
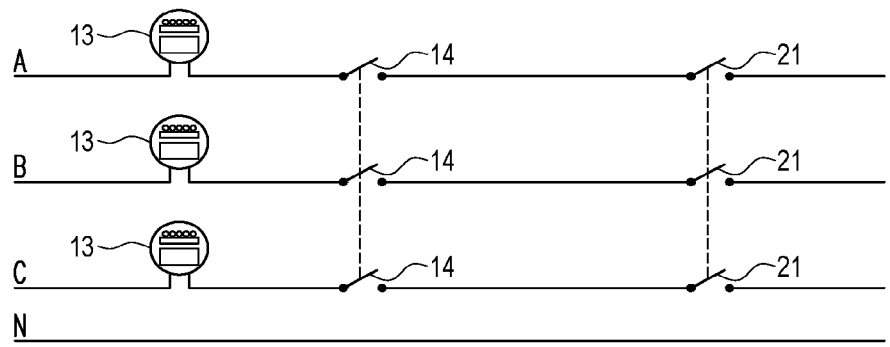
FIG. 7 illustrates the load compensation device of FIG. 1 showing the switching of contactor coils of the system of FIG. 3.
Figure 7:
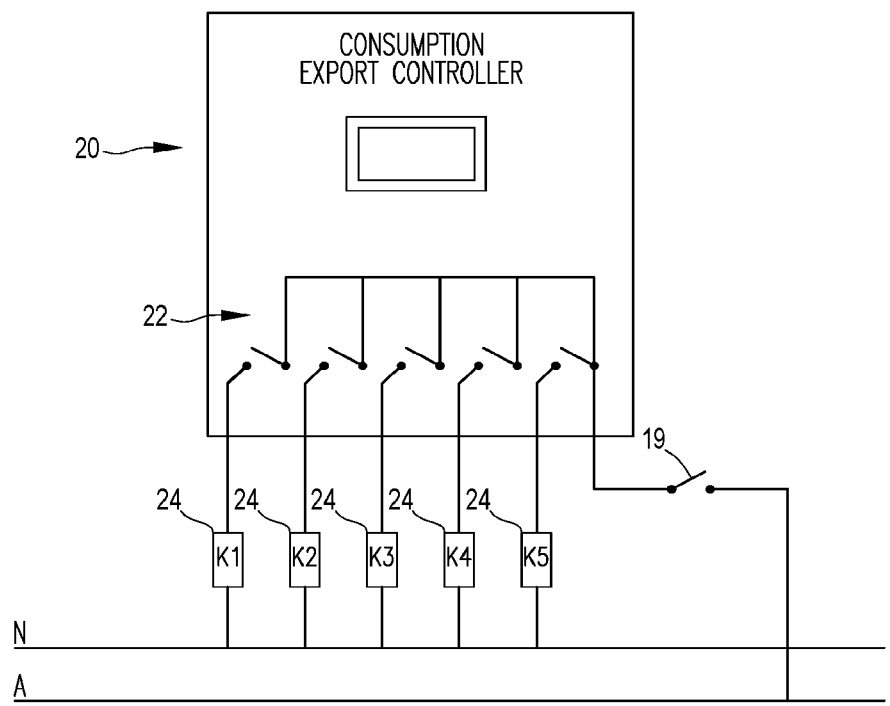

FIG. 7 shows the switching of the coils 22 to control the contactors 24 (K1 to K5). For example, when consumption is generated by sub circuits 16 as sensed by the voltage or current sensing 30, 34 the load compensation device 20 will energise solar strings 41, 42, 43, 44, 45 to compensate for the usage of load from the mains power supply 11.

Figure 8:
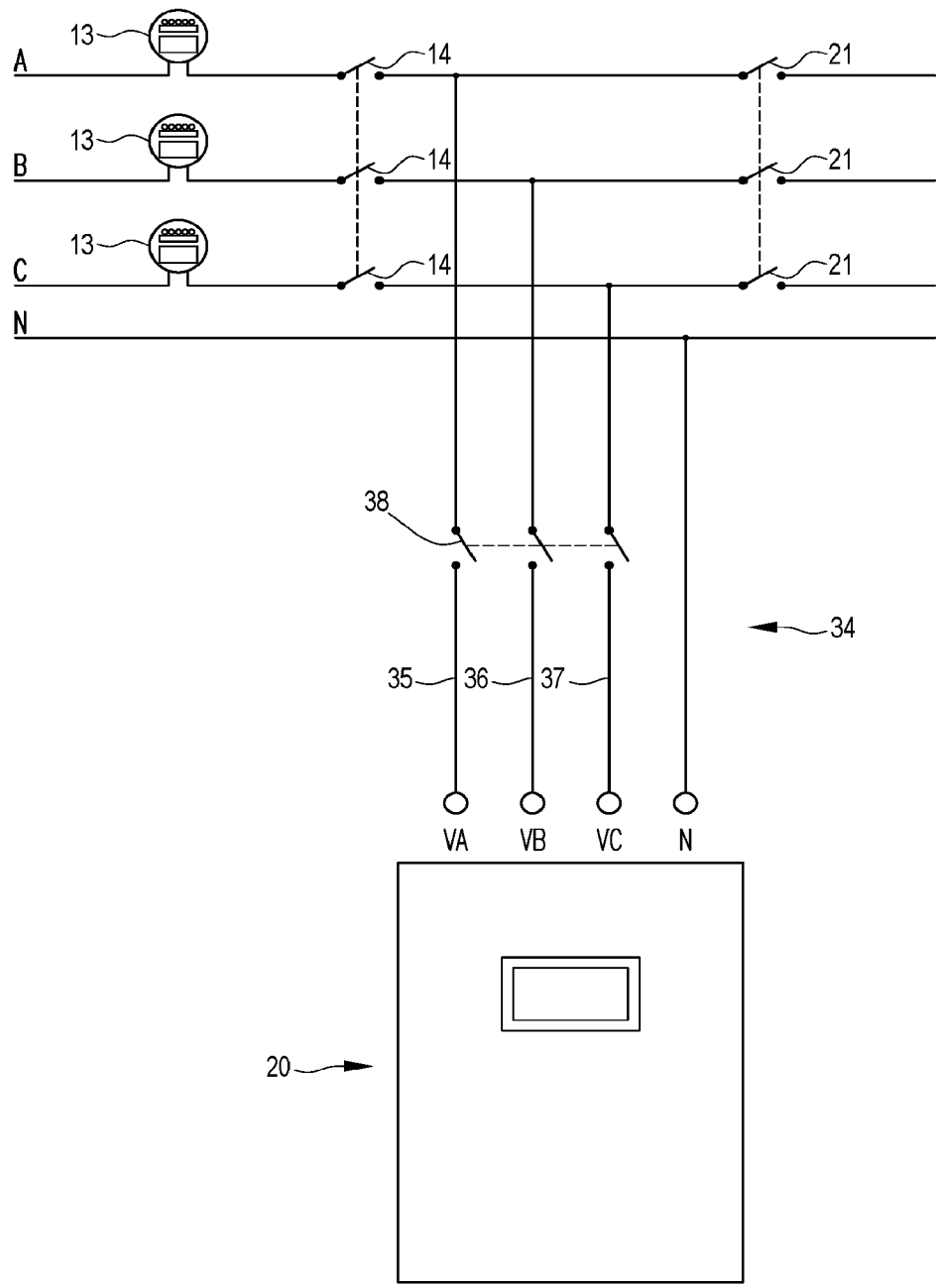
FIG. 8 shows the voltage sensing and input from the main supply to the load compensation device of FIG. 3.
Figure 9:
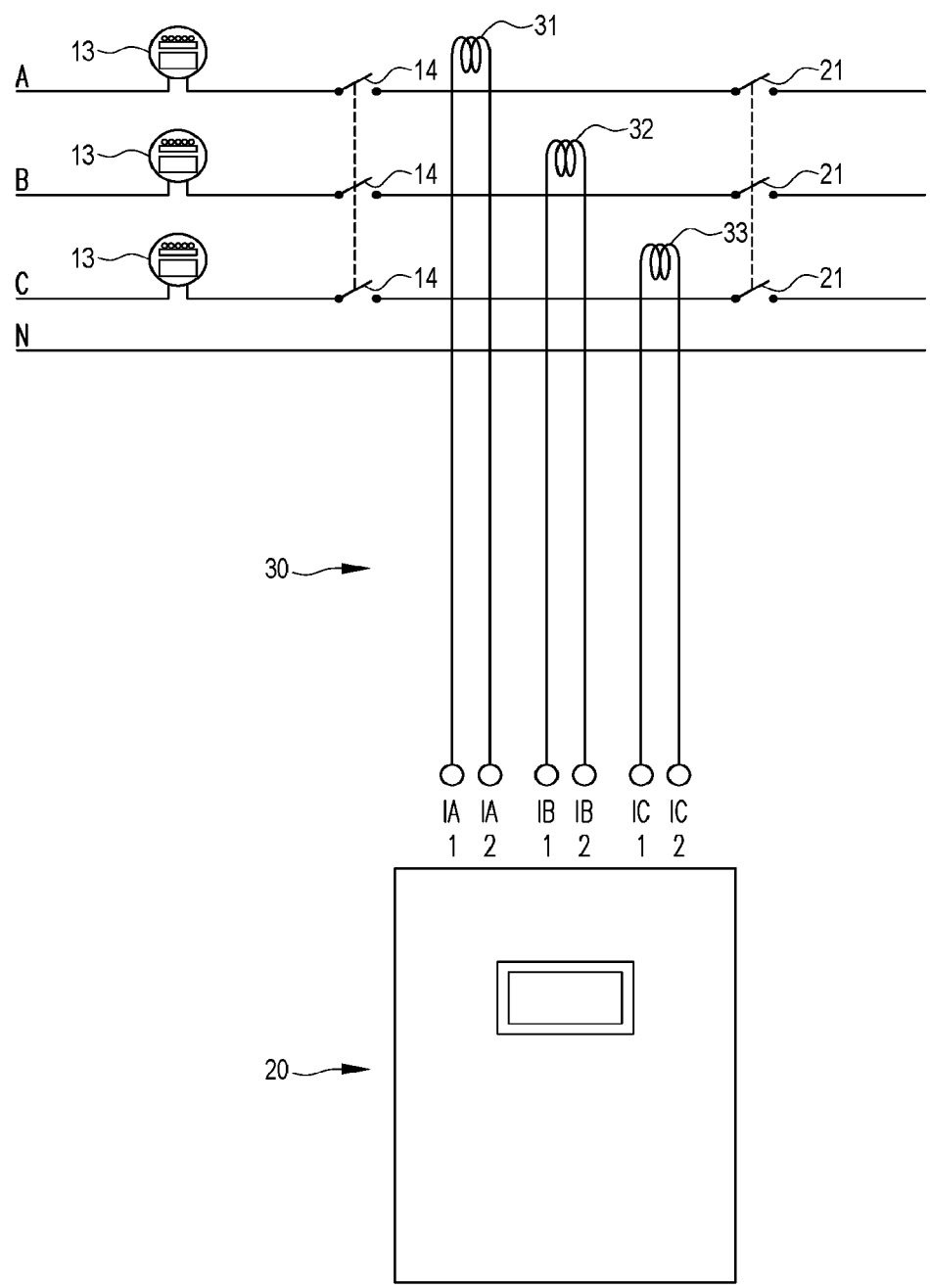
FIG. 9 shows the current sensing and input from the main supply to the load compensation device of FIG. 3.

FIG. 8 (voltage sensing 34) and FIG. 9 (current sensing 30) show the two forms of sensing the site load on the mains power supply 11. In FIG. 8 the voltage 35, 36, 37 on each phase of a three phase system is sensed and returned to the load compensation device 20. The voltage sensing 34 can be connected or isolated from the system 10 by circuit breaker 38. FIG. 9 shows current sensing 30 using CT's 31, 32, 33 on each phase of a three phase system.

Figure 10:
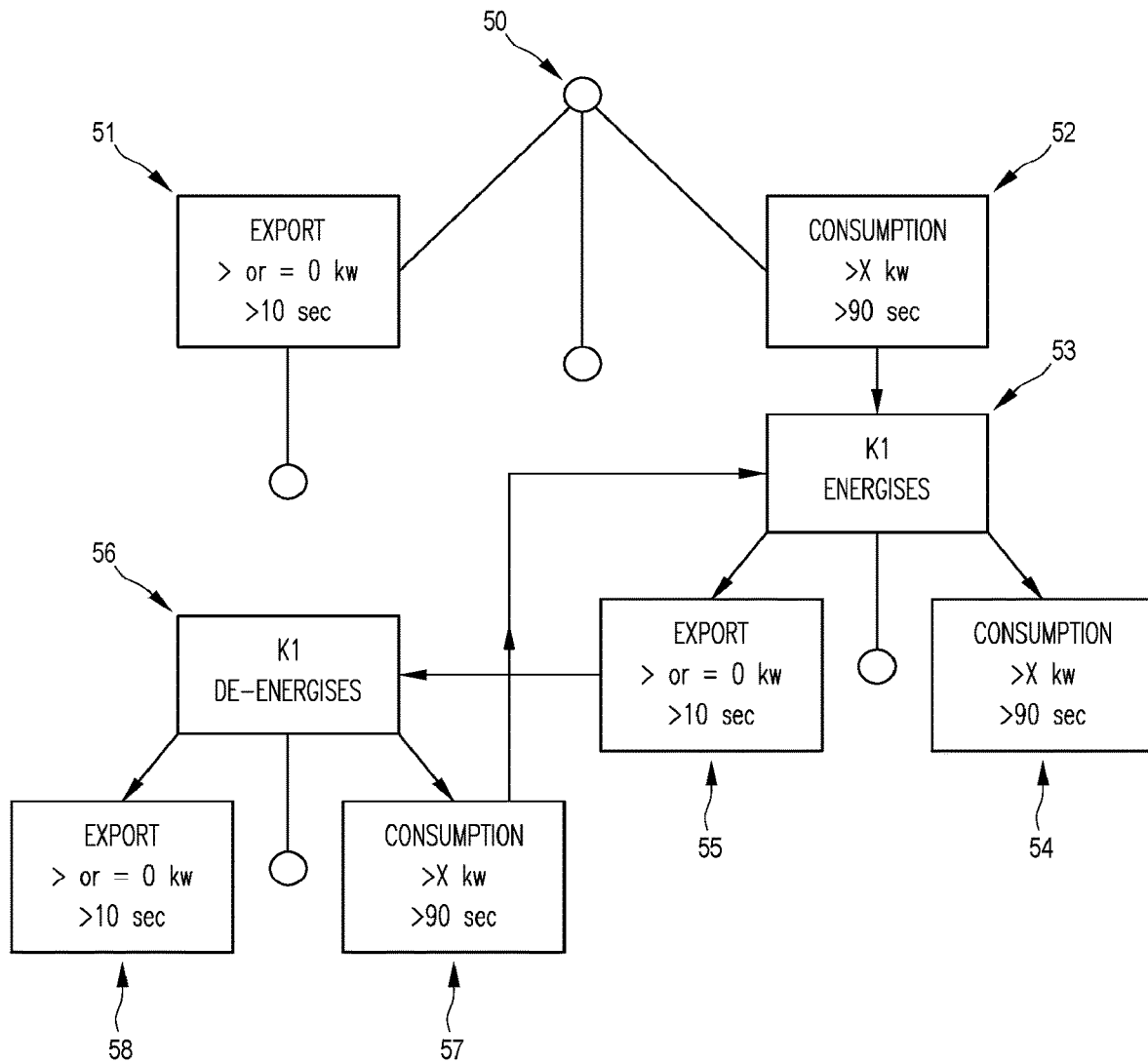
FIG. 10 shows a flow chart of only the first inverter of the system showing timing for connection and disconnection.
Figure 11:
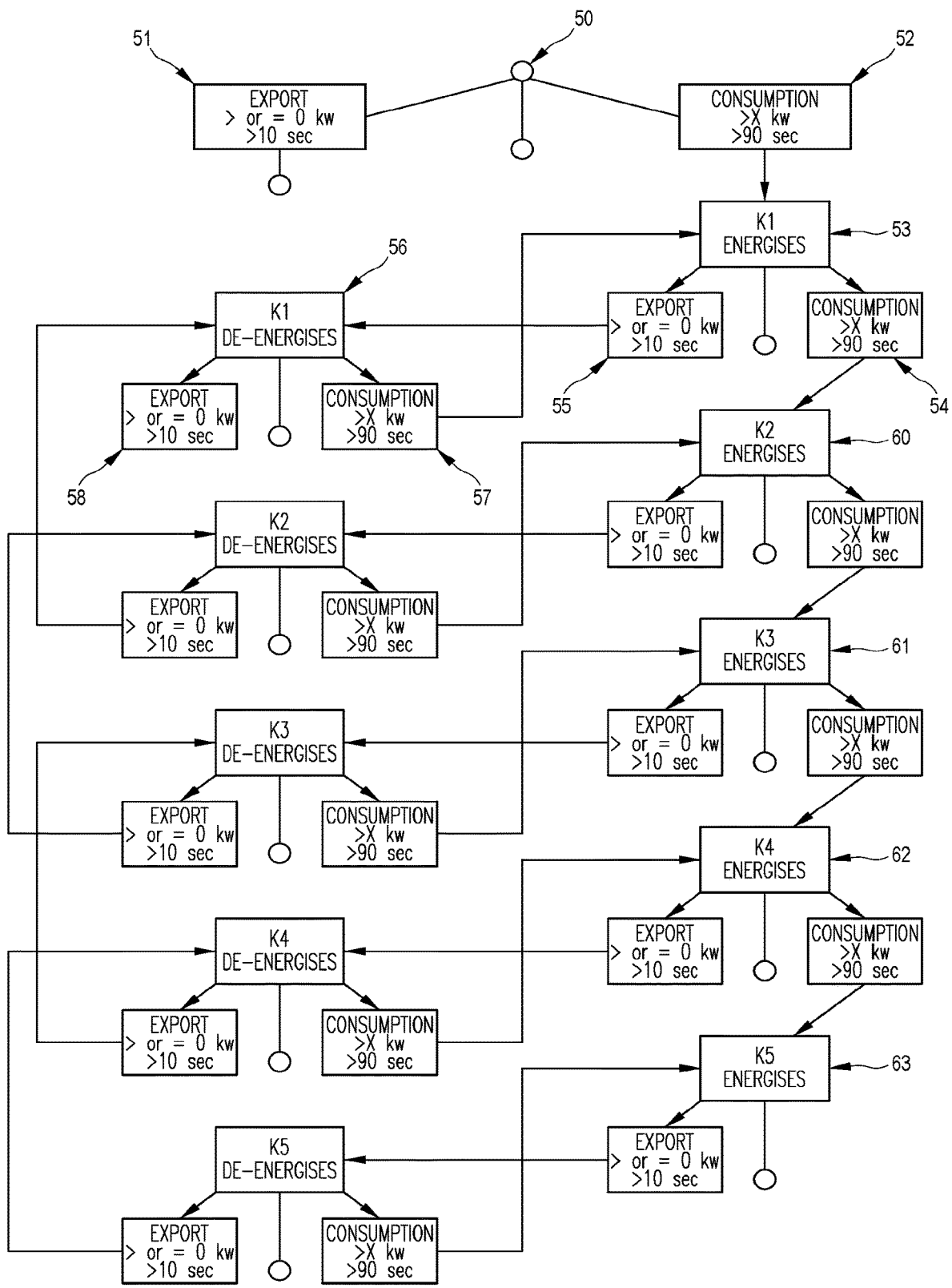
FIG. 11 shows the flow chart for all inverters in the system of FIG. 1.

FIGS. 10 and 11 show flow charts of the control process and timing for the energy load compensation system 10. FIG. 9 shows only the energising and de-energising of the K1 contactor. FIGS. 9 and 10 shows the control process wherein the load compensation device 20 is programmed for 0 export and limited consumption. That is to say the load compensation device 20 is programmed with a lower consumption limit of 0 kW and an upper consumption limit of X kW.

The process starts at step 50 at which 0 kW of energy is being consumed as measured at measuring point 30.1. If 0 kW of energy is consumed for greater than 10 seconds, contact or K1 remains de-energised. At step 52 if consumption is greater than X kW for a preset time period of 90 seconds then contactor K1 energises at step 53 to keep consumption within the X kW upper consumption rate limit. At step 55 if consumption decreases to 0 kW or greater, meaning export, for more than 10 seconds then K1 de-energises at step 56 and remains de-energised if no consumption is sensed at step 58. At step 54, K1 remains energised as consumption is greater than X kW for a preset period of greater than 90 seconds. Step 56, K1 remains de-energised, however if load becomes greater than X kW for the preset time period then K1 is energised at step 53.

FIG. 11 shows the flow chart for the energising and de-energising of all strings 41, 42, 43, 44, 45. Steps 50 to 58 are the same as FIG. 10 and each string as represented by steps 60, 61, 62 and 63 are replicated with the exception that if energy continues above X kW then each contactor K1 to K5 are energised respectively. Likewise as energy decreases below X kW contactors K5 to K1 are de-energised. Alternatively and an advantage of the present system comprising a programmable microprocessor in the load compensation device 20, allows the order of energising to be changed and any order may be programmed into the load compensation device 20.

A designer of the system chooses X taking into account a number of factors, including the design kW size of each solar string 41 to 45. Purely as an example, if the solar strings included a solar array 26 and inverter 25 capable of producing 10 kW (assuming 100% efficiency), then X may be selected to be 10.5 kW. This is to prevent a solar string from being brought online only to be isolated again (also known as on-off cycling) because bringing the solar string online causes the system to export energy (over the lower export limit of 0 kW for the system). When consumption is higher than the set rate of 10.5 kW for 90 seconds, K1 is energized, which brings 10 kW from the PV string 41 online. A PV string is "online" when its associated contactor 24 is closed so that power from its inverter is supplied. The consumption (assuming the site load from sub-circuits 16 remain constant) will then fall below the upper consumption limit of 10.5 kW to 0.5 Kw (10.5 kW−10 kW=0.5 kW).) K1 remains energized unless the consumption changes to export (exporting in reverse direction of power flow below the lower consumption limit of 0 kW) or the consumption rises above 10.5 kW again. The consumption can change to export, because the load from consumer circuits 16 fall, or the energy power supply from PV string 41 increases, or a combination of these two factors. Similarly, the consumption may rise above 10.5 kW again if the load from consumer circuits 16 increase or the renewable energy power supply from PV string 41 decrease, or a combination of these two factors. If the consumption rises above 10.5 kW again for more than 90 seconds, K2 is energised to also bring PV string 42 online.

The 10 kW solar string example given above assume 100% efficiency of the solar string. In a real world solar energy fed example of the system 10, the X value may be chosen to be in the region of 87% of the design rating of the solar string. That is because solar strings are never 100% efficient and rarely go over 87% of their rating. The 87% of rated solar string power output as value for X allows the X value to be more than the real world power output from the solar string most of the time, if not all of the time. For a solar string having a 10 kW rated inverter, the X value may thus be chosen as 8.7 kW as the solar string will rarely produce more than 8.7 kW. A similar design methodology may be applied for other renewable energy generation strings such as wind turbines. In other examples of the system 10 where the power generation from each string remains reasonable constant (hydro energy for example) the X value can be set marginally above the known constant power out of the power generation string.

The above is an example of configuring the load compensation device 20 as a limited consumption device or 0 export device where the upper limit is set as 10.5 kW and the lower limited for 0 export is set as 0 kW. The load compensation device 20 thus controls the PV system 8 so that the consumption is maintained in a set range between an upper consumption limit and a lower consumption limit where possible.

To configure the load compensation device 20 as a limited export device, for example, an upper export limit is set as export of X kW (reverse direction power flow). Up to X kW can thus be exported from the PV system to the mains supply 11. If export goes above X kW for a set amount of time the load compensation device 20 will take one of the PV strings offline (isolate the PV string by opening associated contactor 24) to bring the export rate below the set export limit.

It will be appreciated that the example above relies on isolation of the PV strings by switches K1-K5 to step the power output from the PV system 8 up or down as controlled by the load compensation device 20. The output from the PV system 8 may similarly be ramped/stepped up or down by electronically controlling the power output at each of the inverters 25 by binary or digital control.

The inverters 25 may be controlled to have power at the respective inverters 25 ramp up and down in parallel. Alternatively the power output from just one of the inverters 25 may be ramped up or down, followed by ramping up or down the power output from the other inverters one after the other, to match the required power output from the PV system 8 for the required load profile (to maintain consumption/export within the consumption/export limits).

Electronic control of the inverters 25 allow the inverters 25 to remain connected to the site circuits 16 (no isolation) but have a power output variable by the controller 20 between 0% and 100% power output. Rather than selective isolation of the solar strings to manage the power output from the PV system 8, the power output form the inverters 25 are controlled between 0% power output and 100% power output. Control of the power output form the inverters is referred to as electronic control. Electronic control of the inverters 25 provide for quicker power ramp up and ramp down time when compared to stepped isolation of the solar strings. The power from the PV system 8 can also be controlled in smaller increments/steps by electronic control of inverter 25 output as compared to isolation of the inverters 25. Electronic control of the inverters 25, 90 can provide almost infinite control to throttle the power output (up or down) from the PV system 8.

An example where a single inverter 90 is controlled to ramp up or down during load compensation is described with reference to FIGS. 13 and 14.

Figure 12:
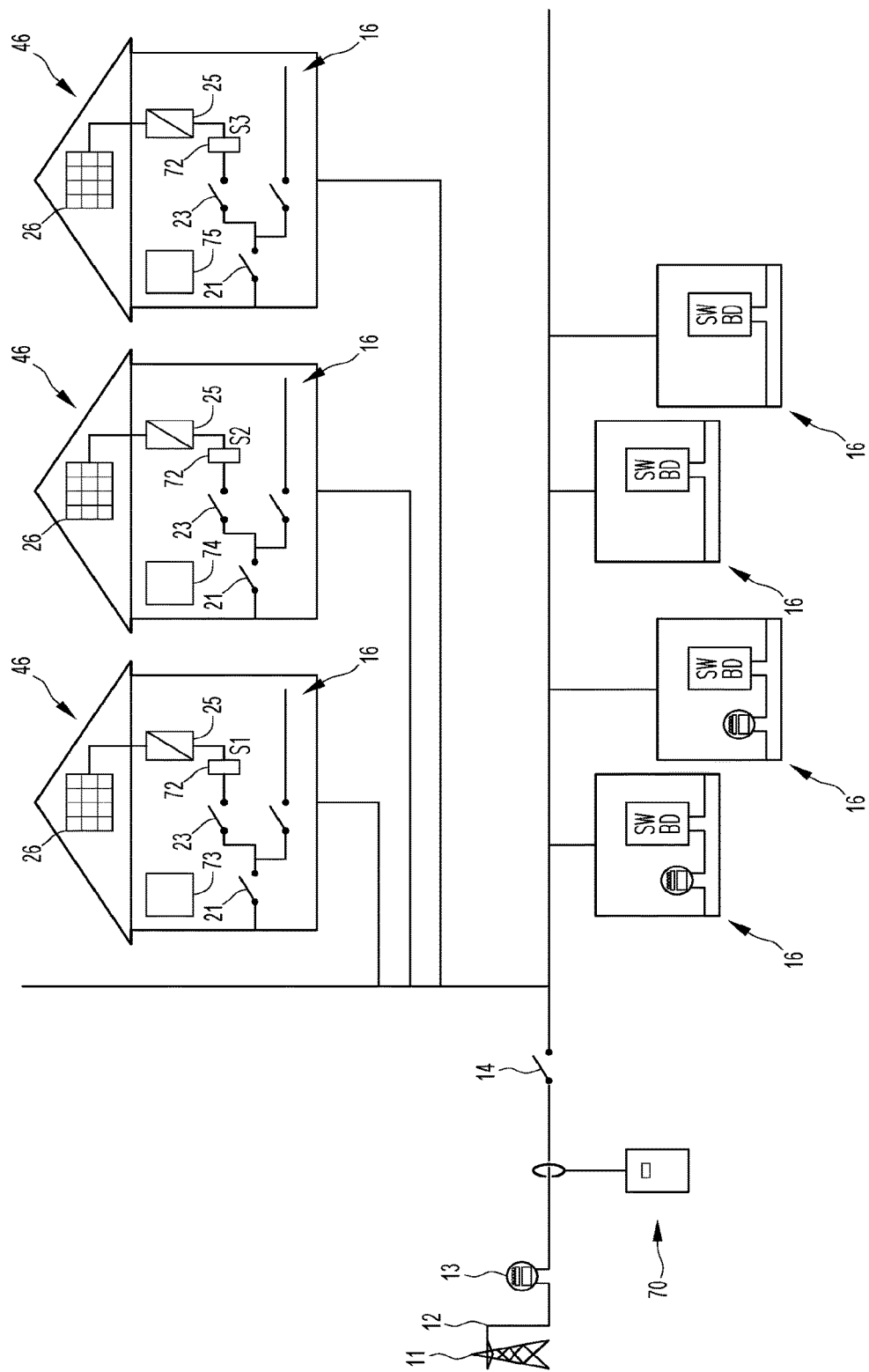
FIG. 12 illustrates the system of FIG. 1 installed in a master slave relationship.

FIG. 12 illustrates another use of the present invention with the energy load compensation system used as a master and slave installation. Master/slave is a model of communication where one device or process, the master 70 has unidirectional control over one or more other devices, slaves 73, 74, 75. The master load compensation device 70 has control over each slave 73, 74 and 75. In each dwelling 46 a slave load compensation device 73, 74, 75 is controlled by respective contactors 72 (S1 to S3) which are energised and de-energised by the master load compensation device 70. Each dwelling has a renewable energy source 26 (PV array), inverter 25, sub-circuits 16, and slave isolation switch 23. The master load compensation device 70 is in control of a mini-grid of grid connected renewable energy installations as well as other loads 16. Like the load compensation device 20 the master load compensation device 70 has been designed to continuously measure and monitor both forward and reverse direction of power flow in the mains power supply 11.

For example if export of renewable energy is connected, when power is in the forward direction (consumption) the master load compensation device 70 will connect first slave 73 with the inverter 25 and solar array 26 designed and sized to the agreed feed in tariff to export renewable energy fed to the grid. If further forward power or consumption is generated by sub circuits 16 the master load compensation device 70 will energise further slaves 74, 75 to compensate for the usage of load from the mains power supply 11. Likewise, when forward power or load decreases the master load compensation device 70 will isolate the further slaves 74, 75 to prevent over generation from the renewable energy source 26. If no load is sensed by the master load compensation device 70 the first slave 73 will also be isolated. It should be identified by a person skilled in the art that any number of slaves may be implemented and the order in which each slave is energised may also be changed, and that the present invention only illustrates three slaves by way of example only.

The power output from inverters 25 of the slave units may similarly be electronically controlled by binary/digital control to ramp power up or down as required by the master or slave controllers 70, 73, 74, 75.

An example use of the master slave configuration is in a caravan park with rental caravans 46 and permanent sites with privately metered installations 16 and other amenities 16 (other loads) such as toilets etc. As illustrated in FIG. 12 the master load compensation device 70 may monitor and control the rental sites as slaves.

Another optional addition to the present system is the use of a data network (not shown) to monitor and control the transmission of data around the system 10. By way of example and as illustrated in FIG. 12 the master controller 70 controlling each slave load compensation device 73, 74, 75 in respective unit installations 46. A data network is an electronic communications process that allows for the orderly transmission and reception of data in this present invention this includes load sensed on the mains power supply 11 and control signals to the respective installations 46. The data network could be either a private data network or a public data network designed to transfer data between various installations 46.

The present invention has been illustrated as a new installation in which the load compensation device 20 and 70 are installed in various new installations with associated components. The present invention also extends to an installation in which only the conventional inverter is replaced (FIG. 13) or a modulator device off the inverter (FIG. 17) is installed.

Figure 13:
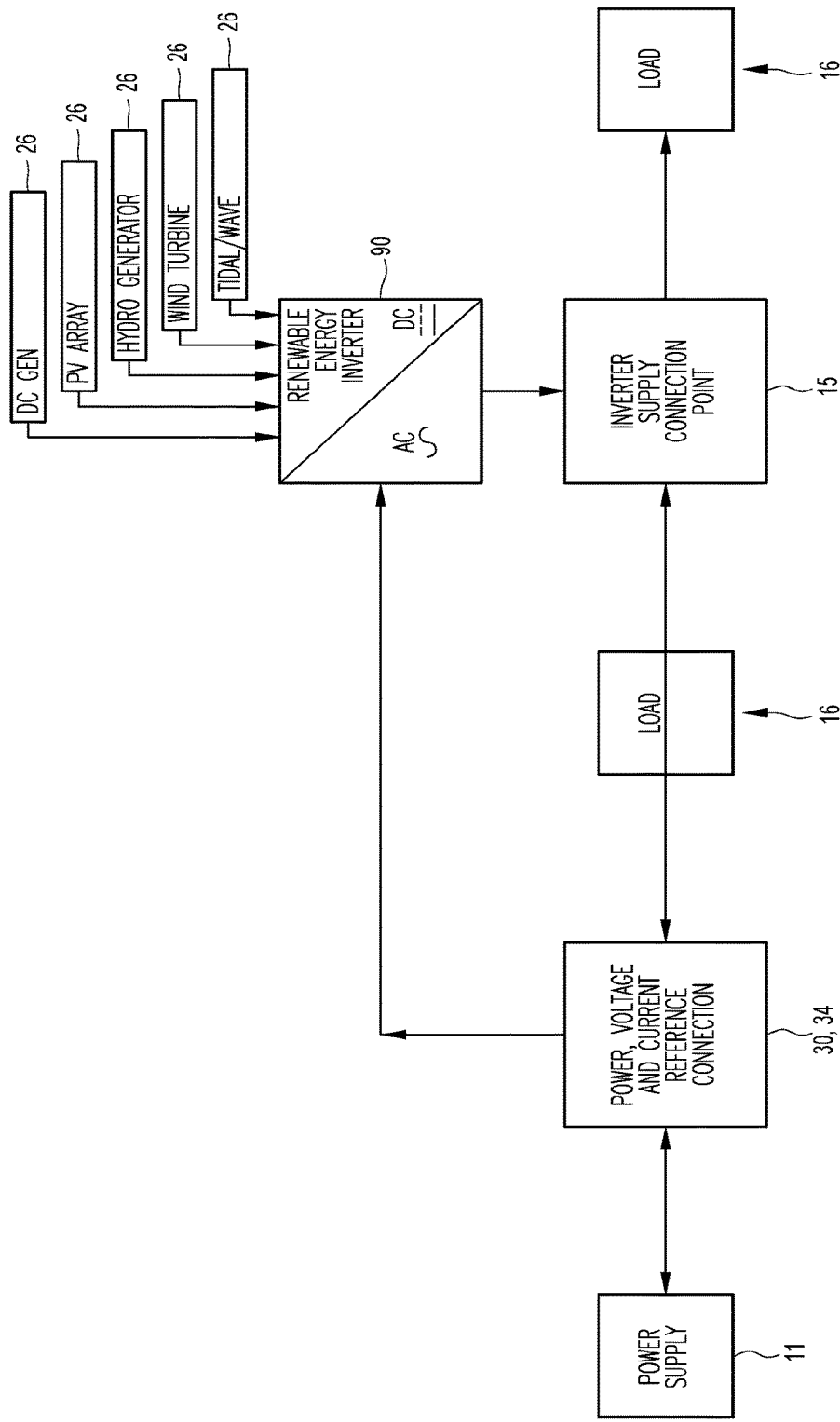
FIG. 13 shows a further embodiment of the present invention in which the renewable energy load compensation device is installed within an inverter used in the renewable energy source.

In FIG. 13 an inverter 90 comprising the load compensation device 20 which can measure and monitor the load on the mains power supply 11 by voltage and current sensing 30, 34 and adjust the power output at the inverter 90. All of the components being installed in the inverter 90 during manufacture. The present embodiment has been designed so that the conventional inverter 25 can be replaced by inverter 90 in accordance with another embodiment of the present invention.

Figure 14:
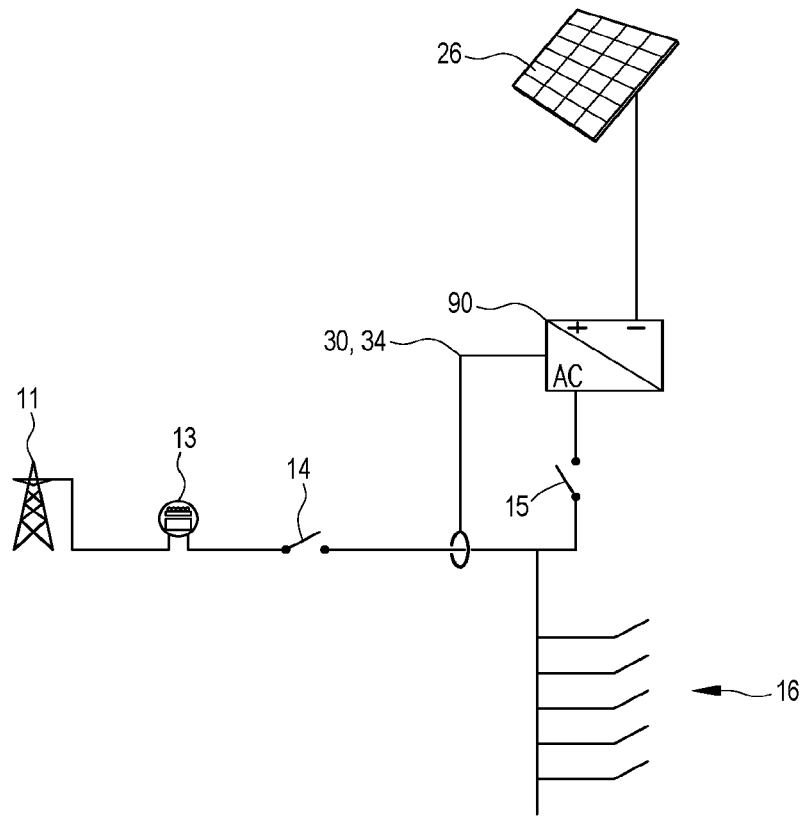
FIG. 14 shows a single line drawing of the renewable energy load compensation device installed within the inverter of FIG. 13.
Figure 15:
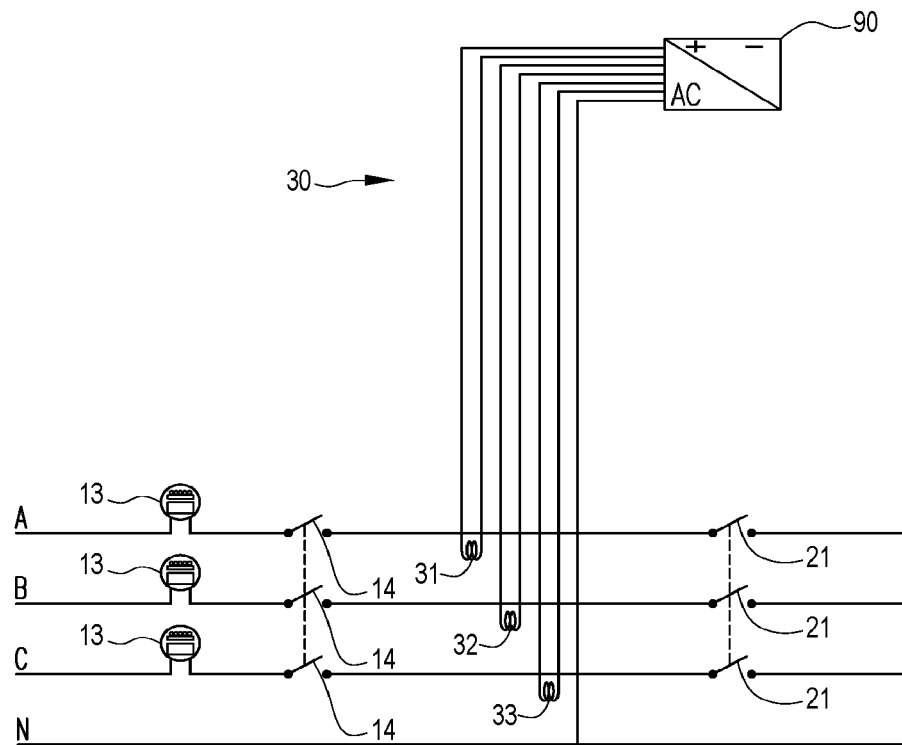
FIG. 15 shows the current sensing and input of the current sensing into the inverter of FIG. 13.
Figure 16:
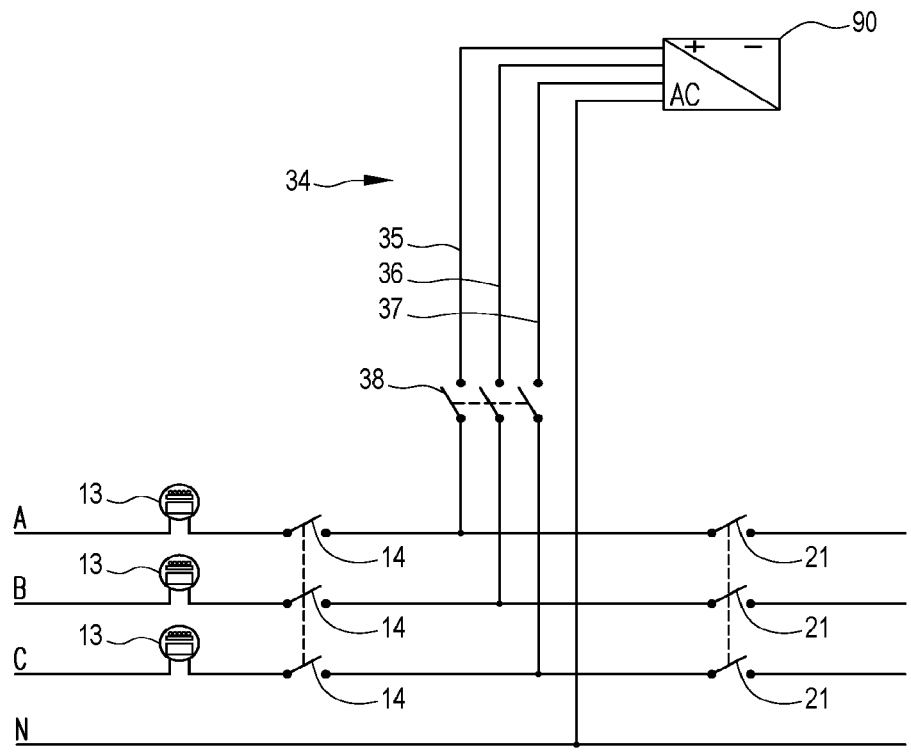
FIG. 16 shows the voltage sensing and input of the voltage sensing into the inverter of FIG. 13.

FIGS. 14 to 16 also show single line diagrams of the present embodiment in which inverter 90 is installed as well as showing the voltage (FIG. 16) and current sensing (FIG. 15) and inputs into the inverter 90 from the voltage and current sensing circuits.

Figure 17:
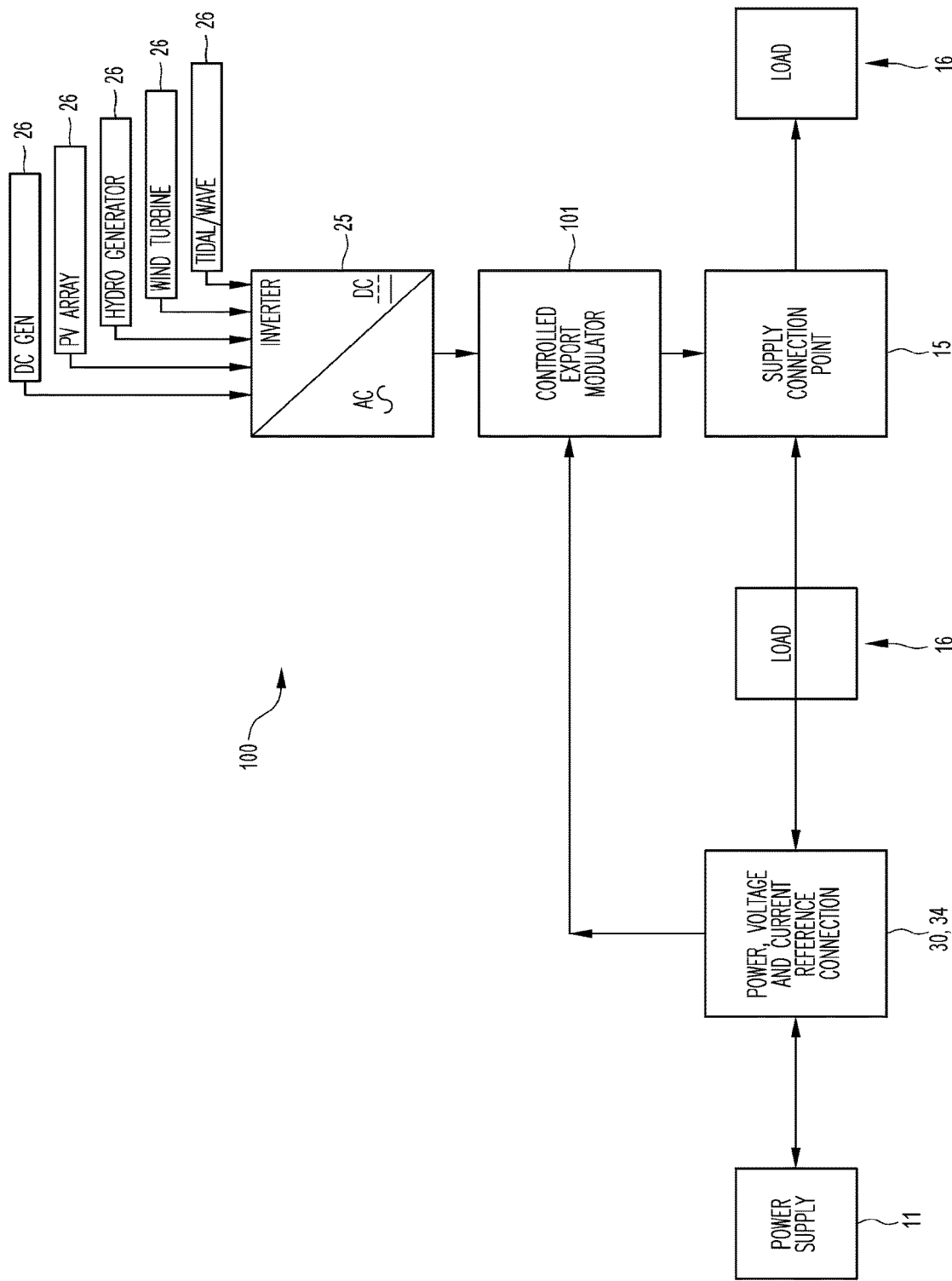
FIG. 17 shows a further embodiment in which the load compensation device is installed as an add on or retrofit of an inverter.

FIG. 17 shows a further arrangement in which the load compensation system 100 is installed as a modulator device 101 off the inverter 25. In this arrangement the device 101 is a separate device with the same capabilities as the previous load compensation device 20, but supplied separately from the inverter 25. In this arrangement the device 101 is easily used as a retro-fit of an existing renewable energy installation. Retrofit projects typically replace or add equipment to existing installations to be able to continuously measure and monitor both forward and reverse direction of power flow in the mains power supply 11. The modulator device 101 provides a variable output to the mains supply 11 and to the loads 16 and can measure and monitor the load on the mains power supply 11 by voltage and current sensing 30, 34 and adjust the power output and/or reactive power output at the modulator 101 in line with the load sensed.

Figure 18:
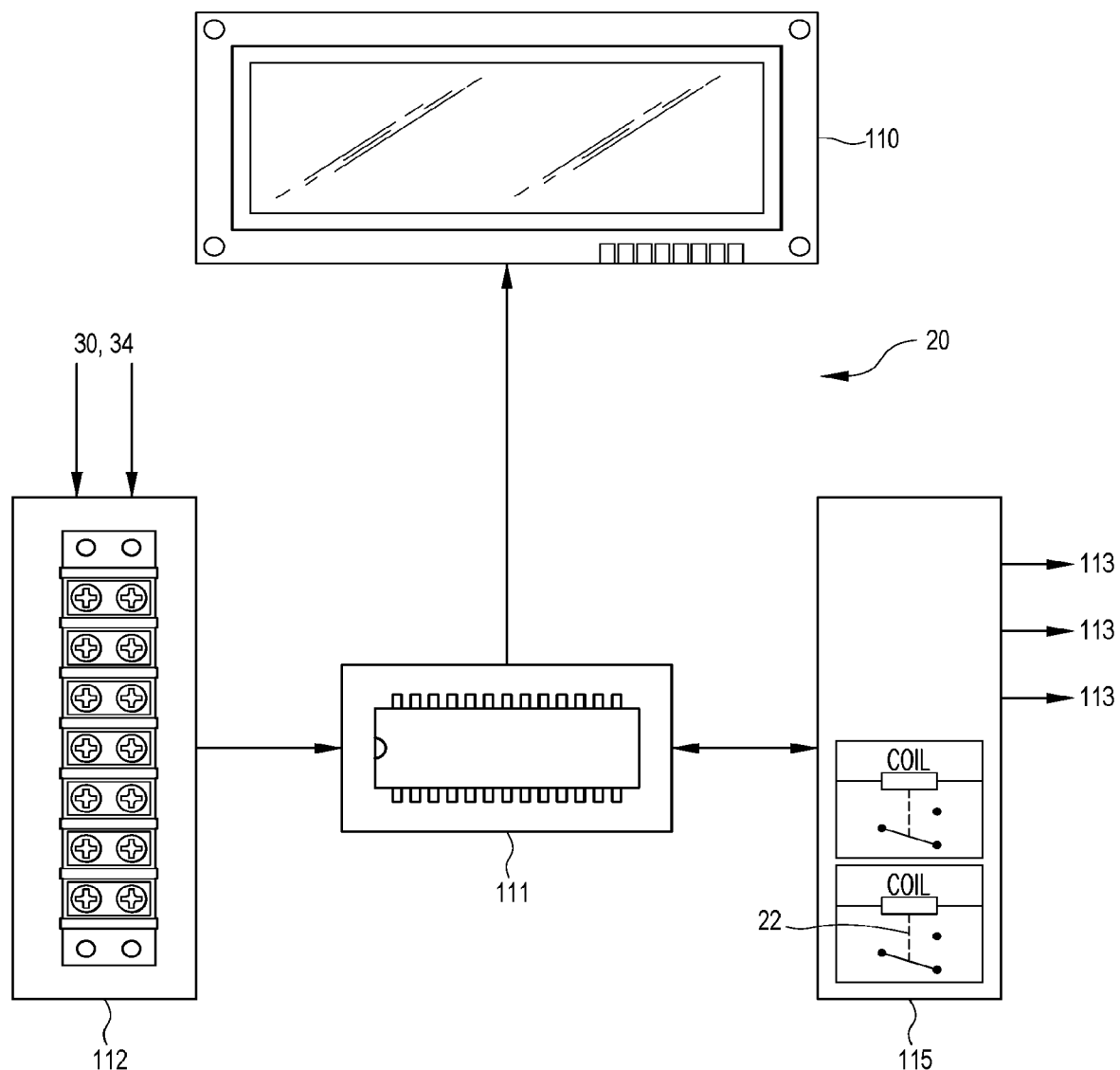
FIG. 18 shows a block diagram of the main components of the load compensation device of FIG. 1.
Figure 19:
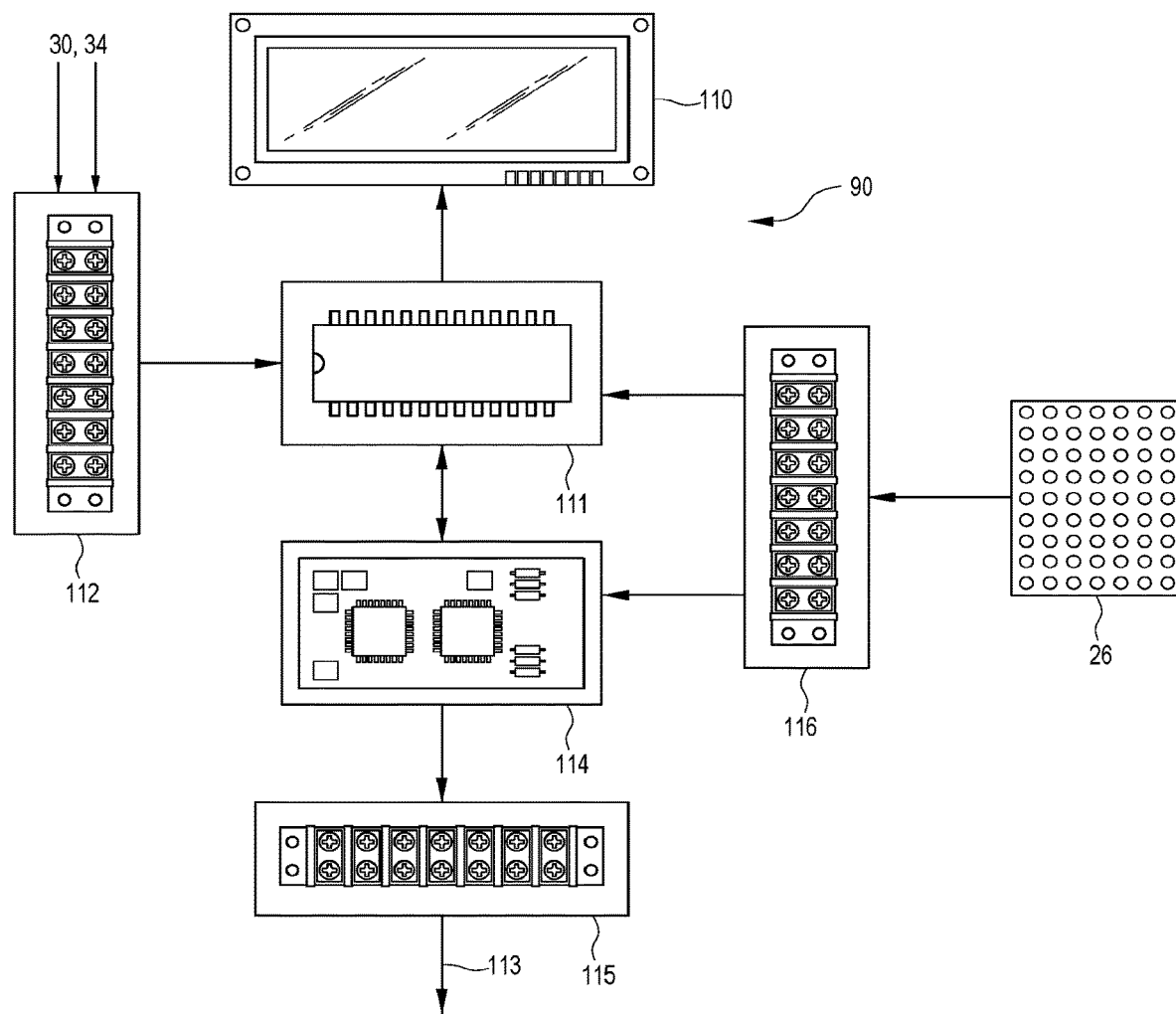
FIG. 19 shows a block diagram of the main components of the load compensation device of FIG. 13.
Figure 20:
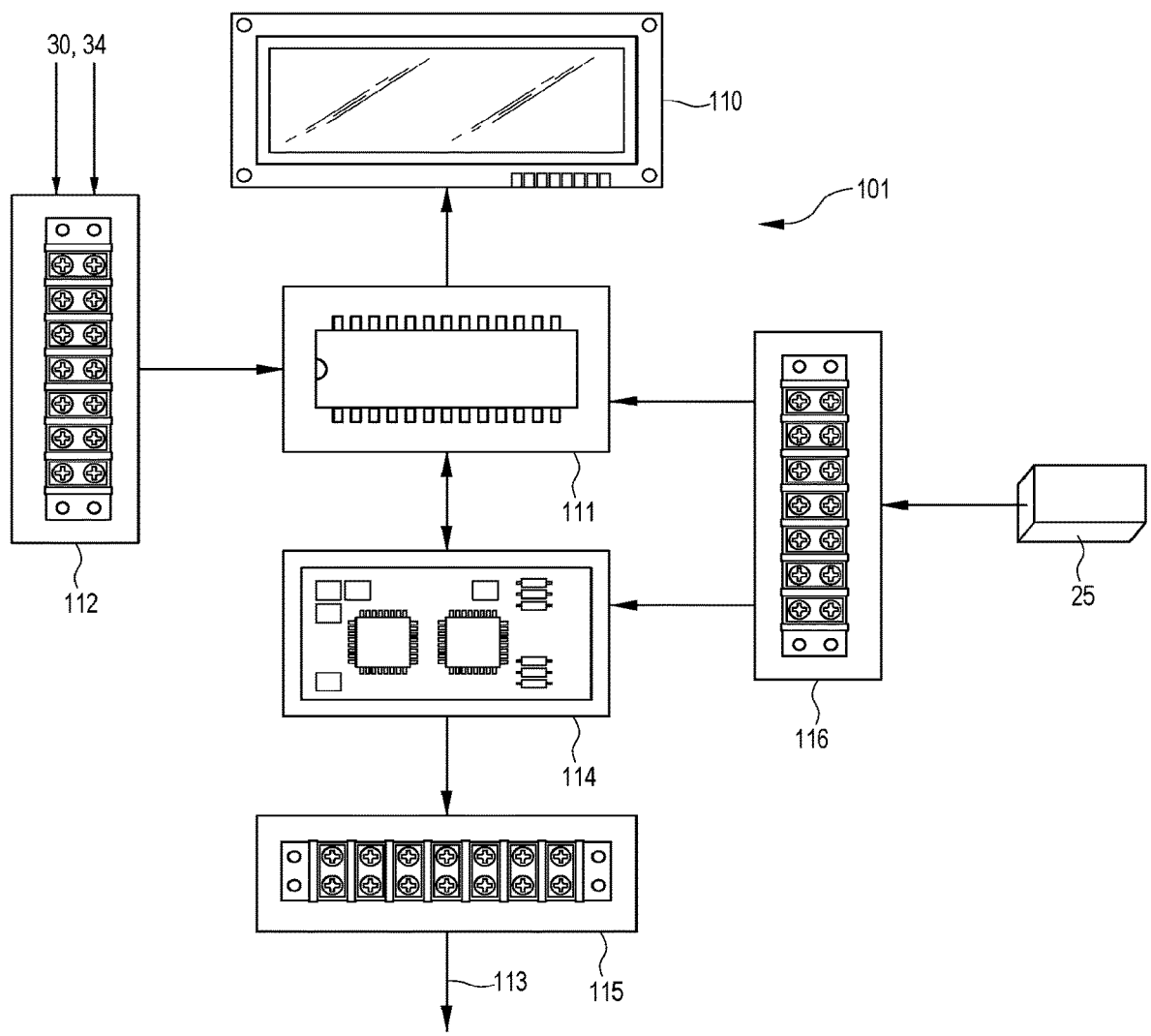
FIG. 20 shows a block diagram of the main components of the load compensation device of FIG. 17.

FIGS. 18 to 20 show block diagrams of the respective load compensation devices 20, 90, 100. In FIG. 18 shows the load compensation device 20 including a microprocessor 111, a display 110, voltage and current sensing input terminals 112 with inputs from the voltage and current sensing 30, 34. Control relays 22 and output terminals 115 which connect the control signal outputs 113 are also provided in load compensation device 20.

FIG. 19 illustrates a block diagram of inverter 90 including microprocessor 111, a display 110, voltage and current sensing input terminals 112 with inputs from the voltage and current sensing 30, 34. Inputs from the renewable energy source 76 (PV arrays) are fed to input terminals 116 and then to both the microprocessor 111 and the electronic control board/regulator 114 of the inverter 90. Outputs 113 and control relays including output terminals are also provided at 115.

FIG. 20 illustrates the modulator 101 which includes input from the inverter 25 and renewable energy source and all the remaining componentry of the load compensation device 20 including a microprocessor 111, a display 110, voltage and current sensing input terminals 112 with inputs from the voltage and current sensing 30, 34. The electronic control board/regulator 114 of the load compensation device 20 and outputs 113 and control relays including output terminals are also provided at 115.

FIGS. 1 and 6 do not include export of energy to the mains power supply 11. The K1 contactor may be programmed so that a feed in tariff and export are provided.

The inverters 25 used in the present invention and as illustrated in FIG. 3 show a polyphase inverter 25. Alternatively the present invention may also be implemented using single phase inverters 25 on each phase. This provides the added advantage of being able to compensate the load on a single phase without affecting the other two phases. Therefore any one or more of the phases of a multiple phase system can be implemented to compensate for the load on that phase.

Figure 21:
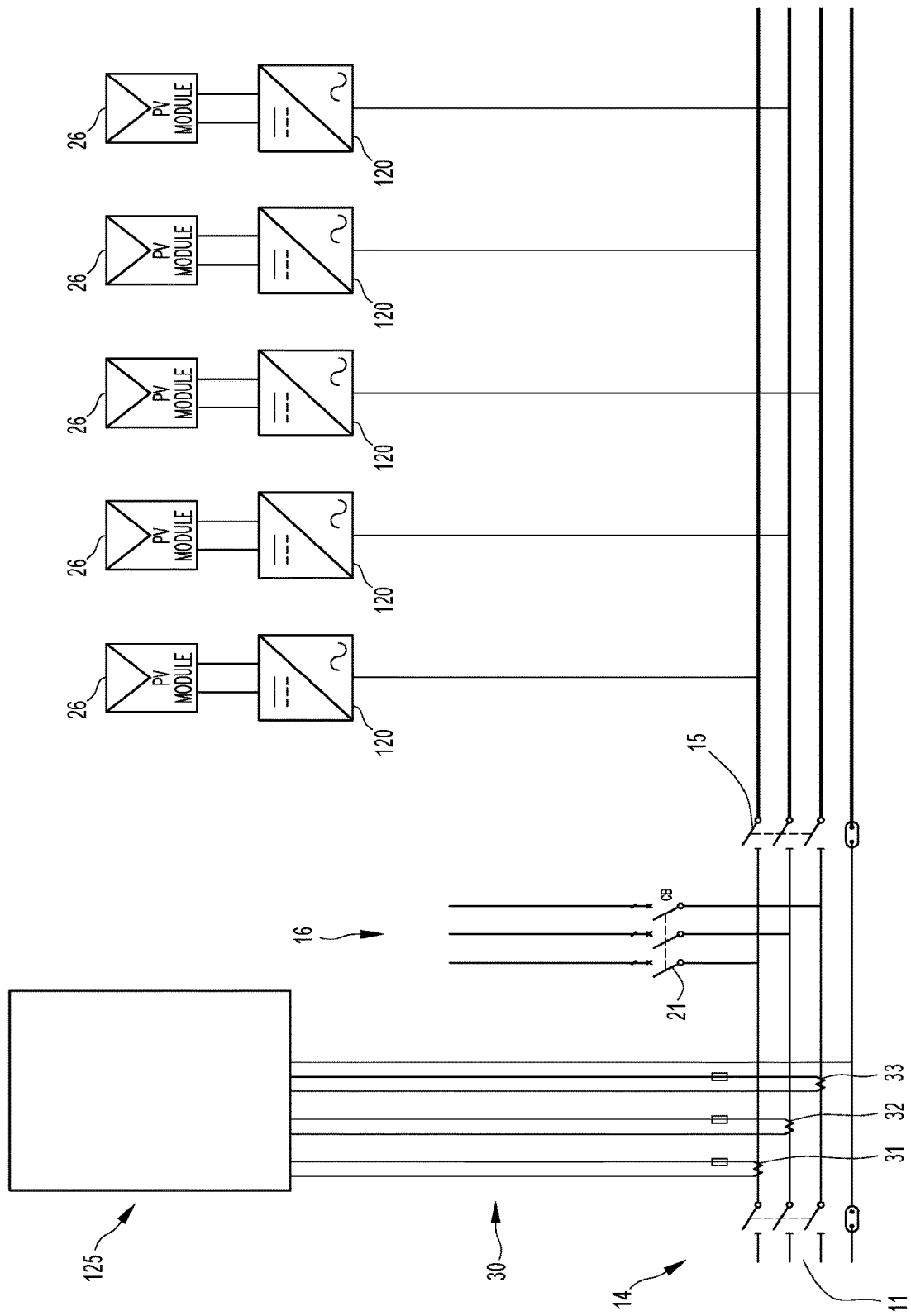
FIG. 21 shows a schematic of a further embodiment of the present invention in which micro-inverters are used to replace conventional inverters.

Alternatively the inverter 25 can include a micro-inverter 120 as shown in FIG. 21 for each panel of a solar array 26. A micro-inverter 120 converts direct current (DC) electricity from one or two solar panels 26 of a solar array to alternating current (AC).

The output from several micro-inverters 120 is combined and often fed to the electrical grid. Micro-inverters 120 contrast with conventional string or central inverter devices, which are connected to multiple solar panels.

Micro-inverters 120 have several advantages over conventional central inverters. The main advantage being small amounts of shading, debris or snow lines on any one solar panel, or even a complete panel failure, does not disproportionately reduce the output of the entire array. Each micro-inverter harvests optimum power by performing maximum power point tracking for its connected panel.

By way of example only, a micro-inverter 120 system can be implemented as shown in FIG. 21 where each micro-inverter 120 is treated as a slave and is controlled by a master load compensation device 125. Likewise each micro-inverter 120 may have its own load compensation device 20 for each photovoltaic module 26. This would be similar to the embodiment described with reference to FIGS. 13 to 16 in which a micro-inverter 120 would replace inverter 90.

Figure 22:
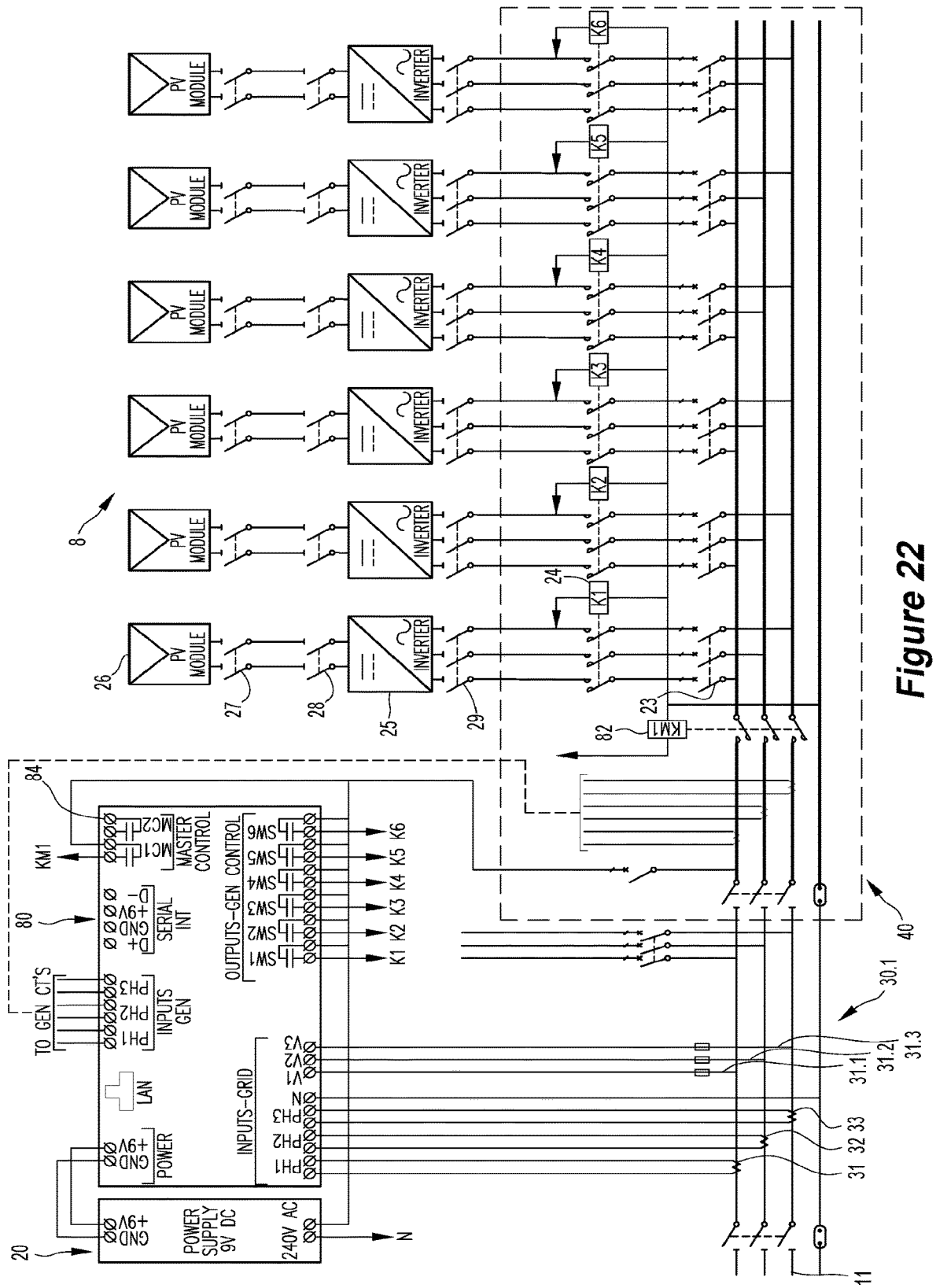
FIG. 22 is a schematic view of a further embodiment of a three phase energy load compensation system in accordance with the present invention.

FIG. 22 shows another embodiment of the energy load compensation system 10 including load compensation device 20. The load compensation device 20 of FIG. 22 includes switches SW1, SW2, SW3, SW4, SW5 and SW6 for switching the contactors K1, K2, K3, K4, K5 and K6, respectively. The switches SW1 to SW6 may also be used for digital control of the power output from the inverters 25 as shown in FIG. 23.

Figure 23:
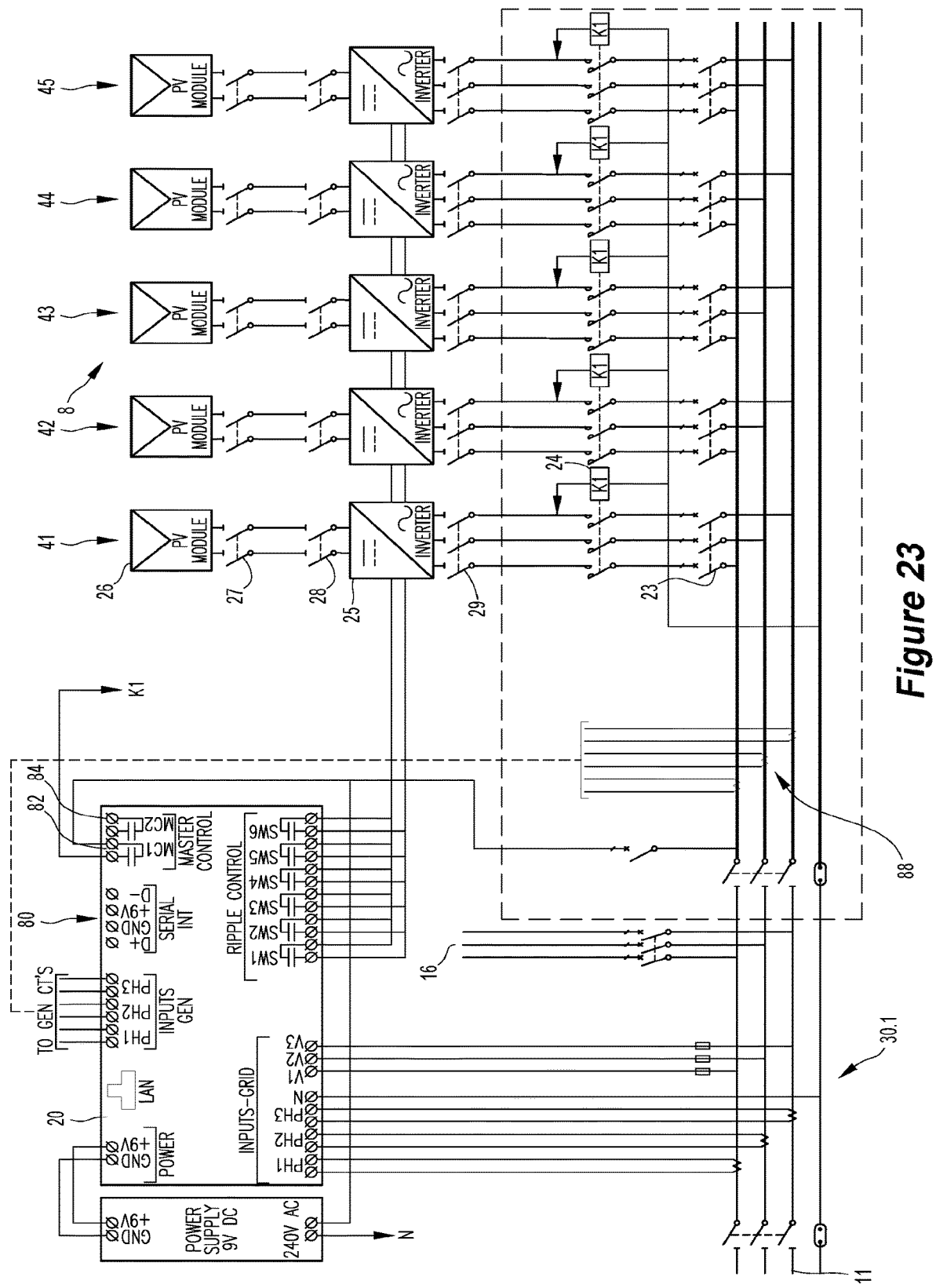
FIG. 23 is a schematic view of a further embodiment of a three phase energy load compensation system with electronic power control in accordance with the present invention.

FIG. 23 shows an embodiment of the compensation system 10 where the first four switches SW1, SW2, SW3, and SW4 can be used for 4 bit digital control to vary the power output from the inverters 25. Each switch SW1, SW2, SW3 and SW4 is connected to a respective digital control input of the inverters 25. Each switch can be either on or off, giving a 16 increments ($4^2$) of controlled power output between 0% and 100%. For example, the inverters 25 can be throttled to 0% power output when all of the switches SW1 to SW4 are opened (4 bit binary 0000). Similarly the inverters may have full power output when all of the switches SW1 to SW4 are closed (4 bit binary 1111). The table below shows one example of the 16 inverter throttle positions for the different on/off combinations of the switches SW1 to SW 4.

| SW1 | 0 | 1 | 0 | 1 | 0 | 1 | 0 | 1 | 0 | 1 | 0 | 1 | 0 | 1 | 0 | 1 |
|---|---|---|---|---|---|---|---|---|---|---|---|---|---|---|---|---|
| SW2 | 0 | 0 | 1 | 1 | 0 | 0 | 1 | 1 | 0 | 0 | 1 | 1 | 0 | 0 | 1 | 1 |
| SW3 | 0 | 0 | 0 | 0 | 1 | 1 | 1 | 1 | 0 | 0 | 0 | 0 | 1 | 1 | 1 | 1 |
| SW4 | 0 | 0 | 0 | 0 | 0 | 0 | 0 | 0 | 1 | 1 | 1 | 1 | 1 | 1 | 0 | 1 |
| position | 0 | 1 | 2 | 3 | 4 | 5 | 6 | 7 | 8 | 9 | 10 | 11 | 12 | 13 | 14 | 15 |
| power | 0% | 13% | 19% | 25% | 31% | 38% | 44% | 50% | 56% | 63% | 69% | 75% | 81% | 88% | 94% | 100% |

The inverters 25 are controlled in parallel, meaning when one inverter is throttled all the inverters are throttled as they are all linked together to the switches SW1 to SW4.

Figure 27:
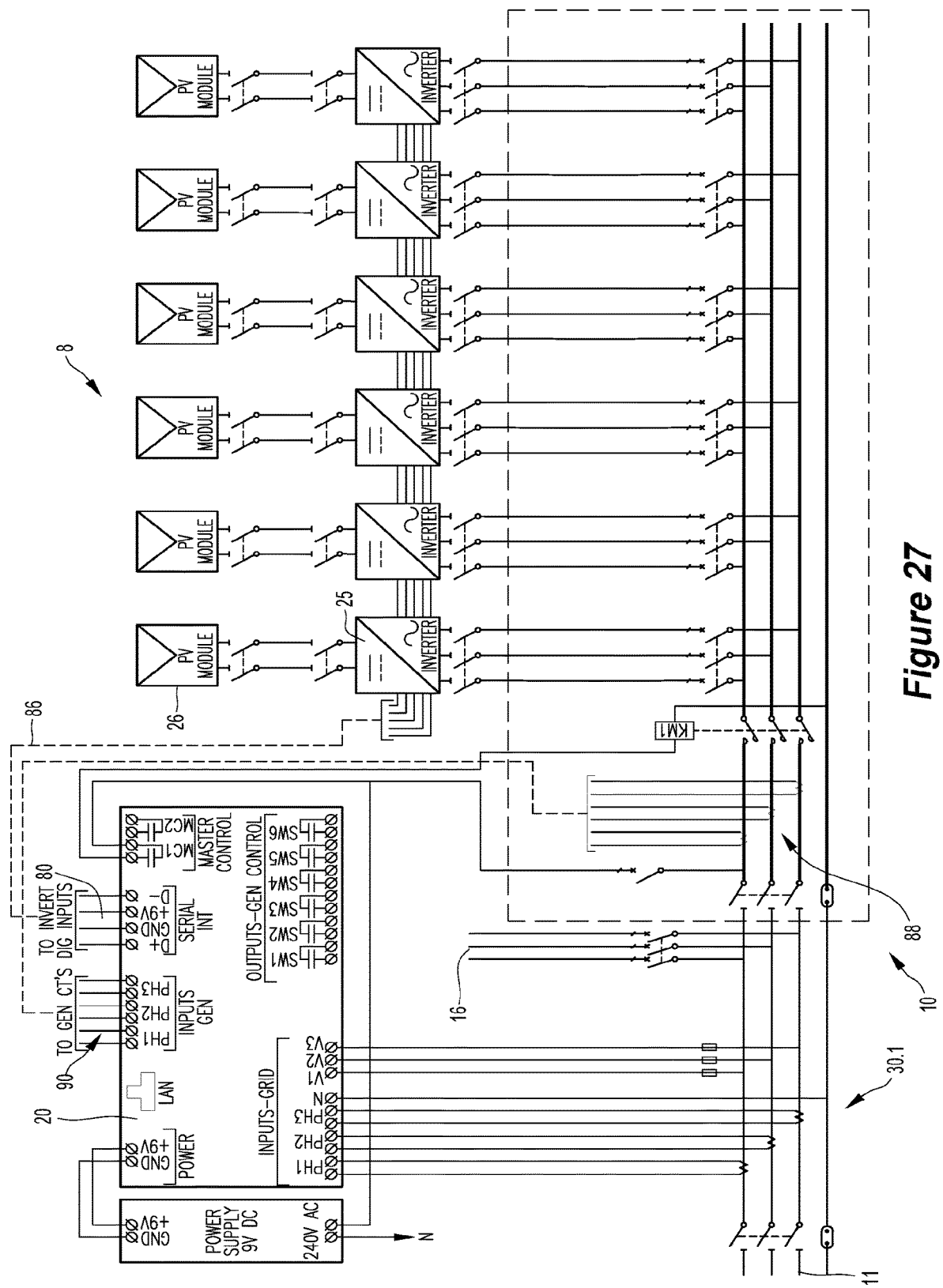
FIG. 27 is a schematic view of a further embodiment of a three phase energy load compensation system including electronic power output control of the inverters via a data link.

The load compensation device 20 of FIGS. 22 and 13 also includes a serial communications port 80. The serial port 80 can be connected via communications link to each of the inverters 25 to electronically control variable power output from the inverters 25. FIG. 27 shows the communications port 80 connected to the inverters 25 via a data cable 86. The inverters may, for example, be controlled using the RS485 standard.

The serial port 80 provides precise control of the power output from the PV system 8. The load compensation device 20 can be configured for the power output from one inverter 25 to be controlled separately from the power output of any of the other inverters 25 via the serial port. For example, the power output from one inverter 25 may be at 100%, the power output of another inverter being ramped up and down between 0% and 100% to follow the load profile of the load (keeping the power flow at the measuring point 30.1 at or close to the lower consumption limit) and the power output of the remainder of the inverters set at 0%. Alternatively, the load compensation device 20 can be configured for the % power output of all of the inverters 25 one to be simultaneously controlled to be the same. For example, the power output of all of the inverters 25 may be ramped up and down between 0% and 100% simultaneously (all inverters has the same % output at any given time) for the power output of the PV system 8 to follow the load profile of the load.

The load compensation device 20 of FIG. 23 shows the sensing of the load using current sensing 30 in the three phases at monitoring point 30.1. The inverters 25 can be electronically controlled via the serial port 80 to vary the power output in each phase supplied by the inverter 25. If the load compensation device 20 measures the phases to be unbalanced at monitoring point 30.1, one or more of the inverters 25 can be controlled by the device 20 to balance the three phase load to the mains supply 11. In particular, each of the phases of power supply from an inverter 25 is individually controlled via the serial port 80 to balance the three phase load. The device 20 is thus operable to control the inverters 25 to balance the three-phase load on site. Each phase independently follows the load, the inverters 25 are controlled so that phase with higher load receives more power generation support from the inverters 25, resulting in a balance of phases measured at the monitoring point 30.1.

The device of FIGS. 22 and 23 includes a Master Control function. The Master Control Function includes two master control relays MC1 and MC2 controlled by the microprocessor 111 of the device 20. The master control relay MC1 is operable to control zero export contactor KM1 (FIG. 22) or K1 (FIG. 23), which corresponds to Zero Export contactor 82 of FIG. 5A. When contactor KM1/K1 is opened by MC1, all of the generation from the solar power system 8 is isolated. The microprocessor 111 is programmed so that zero export contactor KM1/K1 will be opened by relay MC1 of the device 20 when a fault condition is detected, including when export is detected at measuring point 30.1.

Figure 24:
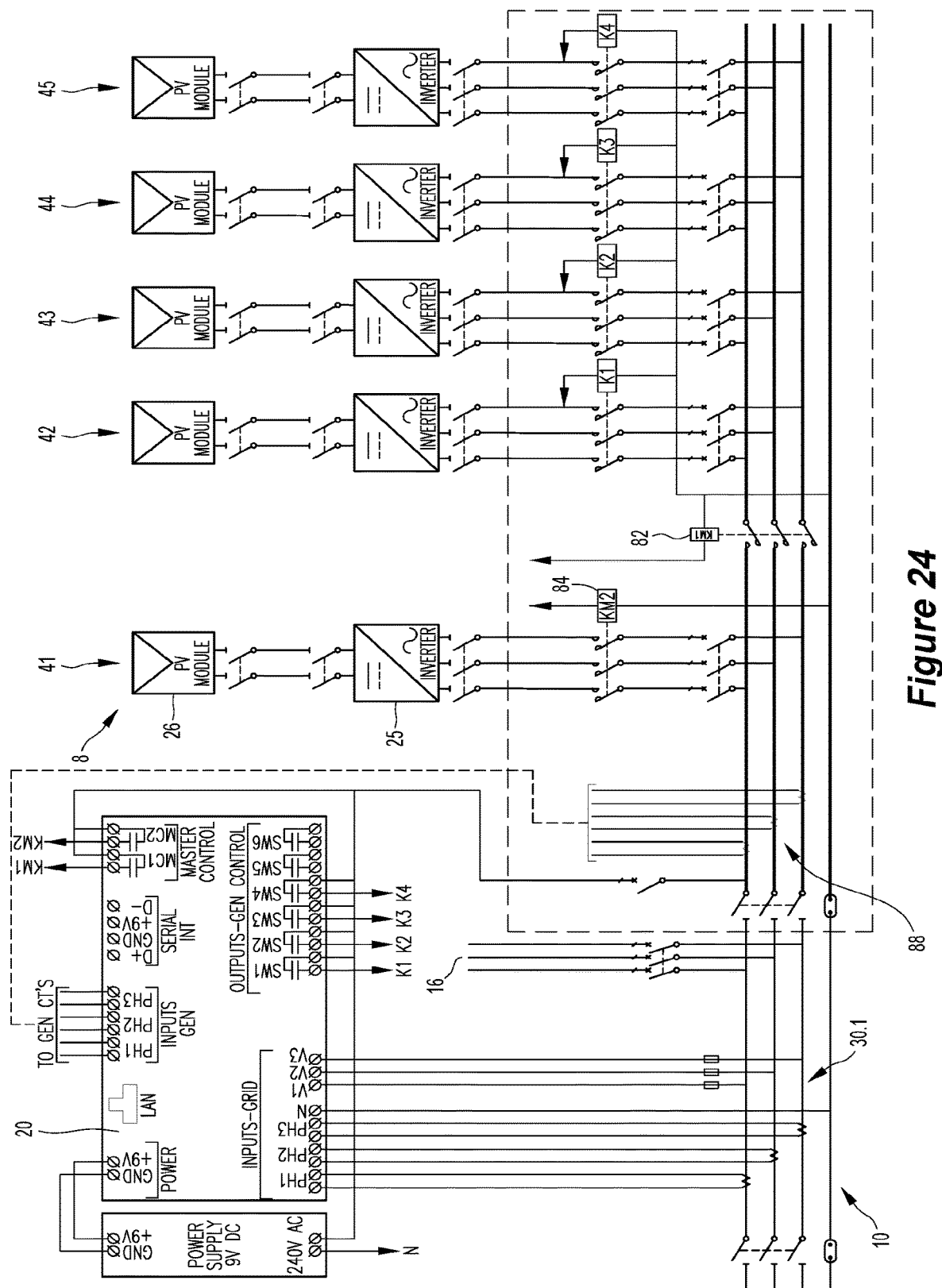
FIG. 24 shows a schematic view of a further embodiment of a three phase energy load compensation system which is set up for energy export from one of the solar strings.

FIG. 24 shows an example of the system 10 configured for power export from the first solar string 41. The microprocessor 111 is programmed so that master control relay MC1 of the device 20 is configured to trip (open) the contactor KM1 (FIG. 24) upon any of the protection events, including export. The microprocessor 111 is also programmed so that master control relay MC2 of the device 20 is configured to trip (open) the contactor KM2 (FIG. 24) upon any of the protection events, other export. Because the system 10 is configured to export power from the solar string 41, the device will not trip contactor KM2 if export (reverse flow of power) is detected at monitoring point 30.1. The first solar string 41 is connected to the mains supply 11 at a connection so that isolation of the further solar strings (42 to 45) by contactor KM1 does not isolate the first solar string 41 from the mains supply 11.

Figure 25:
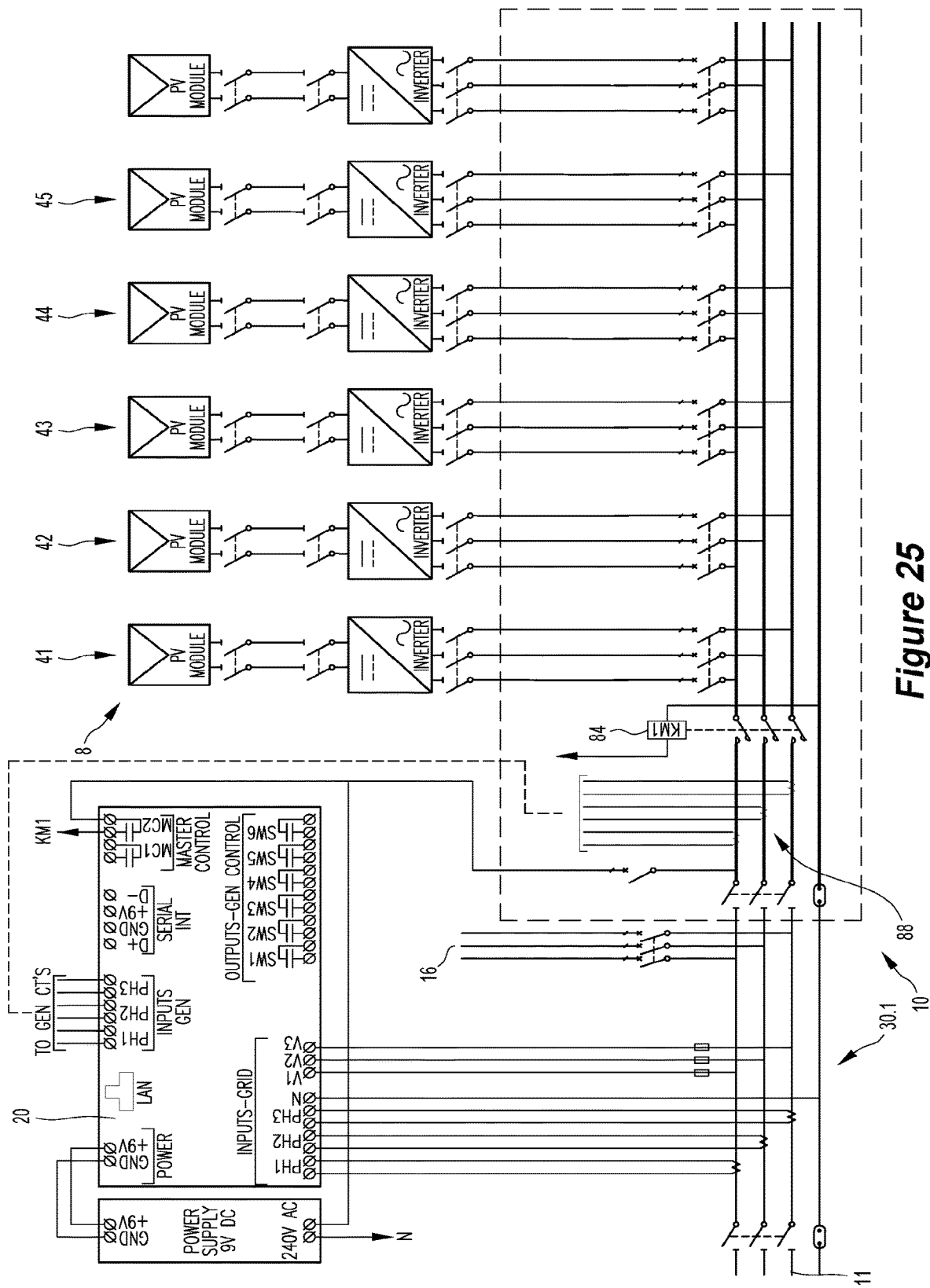
FIG. 25 shows a schematic view of a further embodiment of a three phase energy load compensation system which is set up for full energy export from the inverter energy system.

FIG. 25 shows an example of the system 10 configured for full export of power from the whole of the PV system 8. It will be appreciated that all of the solar strings (including inverters 25) of the PV system 8 of FIG. 25 are connected to the mains supply via contactor KM1. The master control relay MC2 of the device 20 is configured to trip (open) the contactor KM1 upon any of the protection events, other than export protection. Because the system 10 is configured to export power from all of the solar strings, the MC2 will not trip contactor KM1 if export (reverse flow of power) is detected at monitoring point 30.1.

Power output from the PV system 8 may be throttled, up or down as required, either by isolation (FIG. 22) of the PV strings using the contactors K1 to K6, or by electronic control (FIG. 23) of the power output from the inverters 26.

Figure 26:
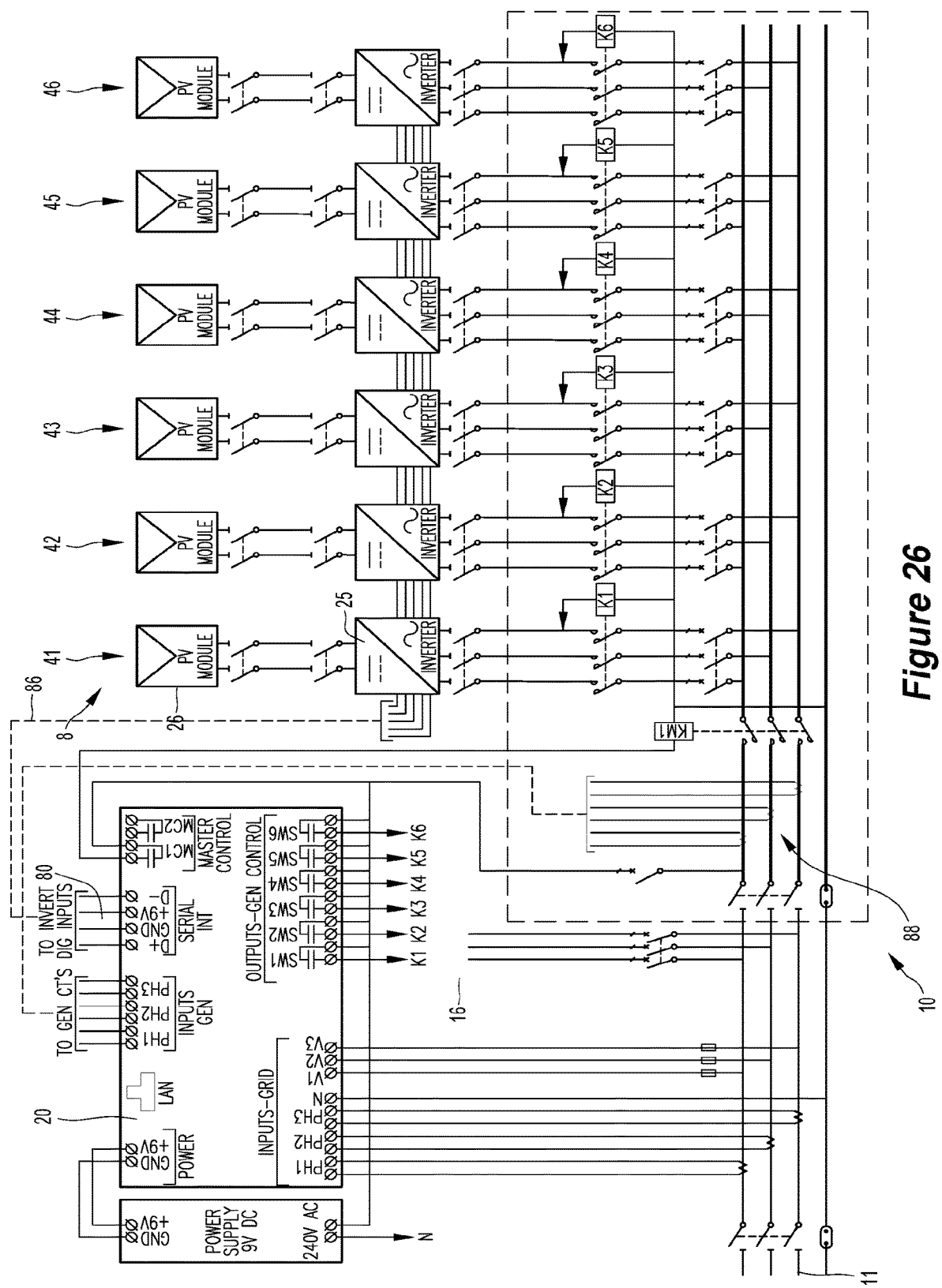
FIG. 26 is a schematic view of a further embodiment of a three phase energy load compensation system including electronic power output control of the inverters and controlled selective isolation of energy strings of the inverter energy system by contactors.

The system 10 may also use a combination of power generation string isolation and electronic control of the power output by the inverters 25 of the strings by the load compensation device 20. FIG. 26 shows the combination of PV string isolation control and digital inverter power output control. The PV strings are taken offline (disconnected from the load) by mechanical isolation via the contactors K1 to K6 and the PV strings which are online (connected to the load) have their power output regulated by electronic control from the load compensation device 20 via the serial port 80. A system 10 wherein the device 20 is configured for combined isolation and electronic control is useful to isolate an inverter 25 independently as needed or required. Being able to digitally control output from the inverters 25 also assist in preventing mechanical isolation of the PV strings.

The systems 10 of FIGS. 22 to 27 include generator current transformers 88 which are operable to measure the generation by the PV system 8. The generator current transformers 88 are connected to inputs 90 of the device 20. The device 20 monitors the power generation of the PV system 8.

The device 20 of FIGS. 22 to 27 may be incorporated into and/or form part of the inverter 90 of FIGS. 13 to 16. Similarly, the device 30 of FIGS. 22 to 27 may be incorporated into and/or form part of the modulator of FIG. 17.

The present invention also allows the consumer to continuously measure, control, and monitor both forward and reverse direction of power flow in the mains power supply. With the use of a data network connecting a control system having a computer readable program stored on the computer the renewable energy load compensation system can be automated or manually controlled by the consumer with the use of a computer.

Also and as is sometimes the case, when the renewable energy load compensation system is not connected for export of energy to the mains supply the inverters may be configured to whatever value desired by the consumer.

For example, a site may be configured for 6.73 kW reverse power on one phase with 5.28 kW on a second phase and 3.45 kW on the third phase. For all of the above options the circuitry has been designed to be energised to connect. Therefore if any fault or failure in the system occurs all items are protected on de-energise. The present invention provides a number of additional programmed protection devices such as over voltage protection, under voltage protection, over frequency protection, under frequency protection, differential frequency protection between the phases, phase failure protection, voltage vector shift (VVS) protection, rate of change of frequency (RoCoF) protection, anti-islanding protection and reverse power flow protection. All of the above are programmable into the load protection device in order to further protect and isolate the system should any one of the faults occur. This also applies to all mechanical isolation devices within the renewable energy load compensation systems which are designed to be energised to connect and therefore on failure or faults will be de-energised to protect both the mains power supply and the renewable energy power supply and associated components.

The device 20 is configured for the following protection functions for the different protection events set out in the paragraphs below with reference to the Zero Export device of FIG. 22:

Over Voltage Protection in accordance with ANSI/IEEE Standard Code 59. Over Voltage protection includes real time monitoring and detection at monitoring point 30.1 of abnormally high network voltage or checking for sufficient voltage to enable closing relays/contactors operation. For example, a detection of Over Voltage at 30.1 of between 255 Vrms and 260 Vrms will have the device 20 ramp down the solar strings by isolation via K1 to K6, in two seconds intervals. The Master Control also opens Zero Export Contactor 82 (KM1) after all the strings are isolated and if the protection fault remains.

Under Voltage Protection in accordance with ANSI/IEEE Standard Code 27. Under Voltage protection includes real time monitoring and detection at monitoring point 30.1 of abnormally low network voltage. For example, detection by device 20 of voltage under 200 Vrms will have the device 20 ramp down the solar strings by isolation via K1 to K6, in two seconds intervals. The Master Control also opens Zero Export Contactor 82 (KM1) after all the strings are isolated and if the protection fault remains.

Over Frequency Protection in accordance with ANSI/IEEE Standard Code 81O. Over Frequency Protection includes detection of abnormally high frequency compared to the rated frequency. For example, detection by device 20 of Frequency above 52 Hz will have the device 20 ramp down the solar strings by isolation via K1 to K6, in 1.5 seconds intervals. The Master Control also opens Zero Export Contactor 82 (KM1) after all the strings are isolated and if the protection fault remains.

Under Frequency Protection in accordance with ANSI/IEEE Standard Code 81U. Under Frequency Protection includes detection of abnormally low frequency compared to the rated frequency, to monitor power supply quality. The protection may be used for overall tripping or load shedding. Protection stability is ensured in the event of the loss of the main source and presence of remanent voltage by a restraint in the event of a continuous decrease of the frequency, which is activated by parameter setting. For example, detection by device 20 of Frequency above below 48 Hz will have the device 20 ramp down the solar strings by isolation via K1 to K6, in 1.5 second intervals. The Master Control also opens Zero Export Contactor 82 (KM1) after all the strings are isolated and if the protection fault remains.

ROCOF Rate of change of frequency in accordance with ANSI/IEEE Standard Code 81R. Rate of change of frequency protection includes fast disconnection of a solar string. It is based on the calculation of the frequency variation, it is insensitive to transient voltage disturbances. The device 20 measures the actual reading of frequency and compares it with the previous frequency measured to see the frequency variation. In case the frequency changes more than a certain set point, for example 0.4 Hz/second, within a certain amount of time it will ramp down the solar strings by isolation via K1 to K6, in 1.5 second intervals. The Master Control also opens Zero Export Contactor 82 (KM1) after all the strings are isolated and if the protection fault remains.

VVS Voltage Vector Shift Loss of Mains. The Voltage Vector Shift functions detects zero crossings of the voltage. It compares the calculated zero crossing from the previous periods with the latest zero crossing. If the difference is larger than the set point, for example 8 degrees, it will activate the respective CEC Action. Set Point 8 degrees, it will ramp down the solar strings by isolation via K1 to K6, in 1.5 second intervals. The Master Control also opens Zero Export Contactor 82 (KM1) after all the strings are isolated and if the protection fault remains. Differential Frequency in Phases. If the device 20 measures more than, for example 1 Hz between phases, it will ramp down the solar strings by isolation via K1 to K6, in 1.5 second intervals. The Master Control also opens Zero Export Contactor 82 (KM1) after all the strings are isolated and if the protection fault remains.

With reference to FIG. 24, Full Export contactor 84 (KM2) will open at the same time as the Zero Export Contactor 82 (KM1) opens for the fault conditions described above with reference to FIG. 22. Full Export contactor 84 (KM2) will not, however, open upon the condition being export of power through monitoring point 30.1, whereas the Zero Export Contactor 82 (KM1) will open on the condition being export of power.

It is also envisaged that a data logger to log and graph each phase of the monitoring point and each phase of the generation point over a predetermined time scale. A data logger or data recorder is an electronic device that records data over time or in relation to location either with a built in instrument or sensor or via external instruments and sensors. The data logger can be based on a digital processor (or computer). The data logger may be a small, battery powered, portable, and equipped with a microprocessor, internal or removable memory for data storage, and sensors. The data logger may interface with a personal computer and utilize software to activate the data logger and view and analyse the collected data.

Data is typically collected in one minute intervals. The collected data can be processed to provide information such as one or a combination of; graphs in amps, kVA, kWatts, total of kWatt hrs for Consumption, Export, Generation, Total usage for the monitored site, Voltage values, Power Factor, Peak Demand with value and time for each day, in digital control the % value of power output of inverters and connected relays.

Likewise the data logger may have a local interface device (keypad, LCD) and can be used as a stand-alone device. The ability of the present invention to monitor power flow at a point and adjust the current output of the inverter is particularly important when considering the real and reactive power flow to the load and as shown in FIG. 13 (inverter 90) and FIG. 17 (modulator 101) the present invention also extends to the monitoring of the reactive power or power factor at the same point or any other relative point and the ability to adjust the supply of reactive power, power factor or phase position of the current output to suit the load. The device 20 of FIGS. 22 to 26 may similarly monitor and control reactive power relative to set power rate limits as is described for active power and control the inverters 25 to assist in power factor correction.

Typically, any practical load will have resistance, inductance, and capacitance therefore both real and reactive power will flow to the load. The ratio between real power and apparent power in a circuit is called the power factor. It is a practical measure of the efficiency of a power distribution system.

The power factor is unity (one) when the voltage and current are in phase. It is zero when the current leads or lags the voltage by 90 degrees. Power factors are usually stated as "leading" or "lagging" to show the sign of the phase angle of current with respect to voltage.

The renewable energy load compensation system of FIGS. 13 and 17 which incorporates the monitoring of the power factor, the power factor would typically be between −0.8 to +0.8 monitored at the monitoring point and supported by the output of the inverter 90 or modulator 101. Similarly, the device 20 of FIGS. 26 and 27 monitors the power factor at the monitoring point 30.1 and electronically controls the output of the inverters 25 (via communications port 80) to correct the power factor.

Each device 20 of Figures is designed to control and monitor either single phase, two phase or three phase PV systems 8.

Figure 28:
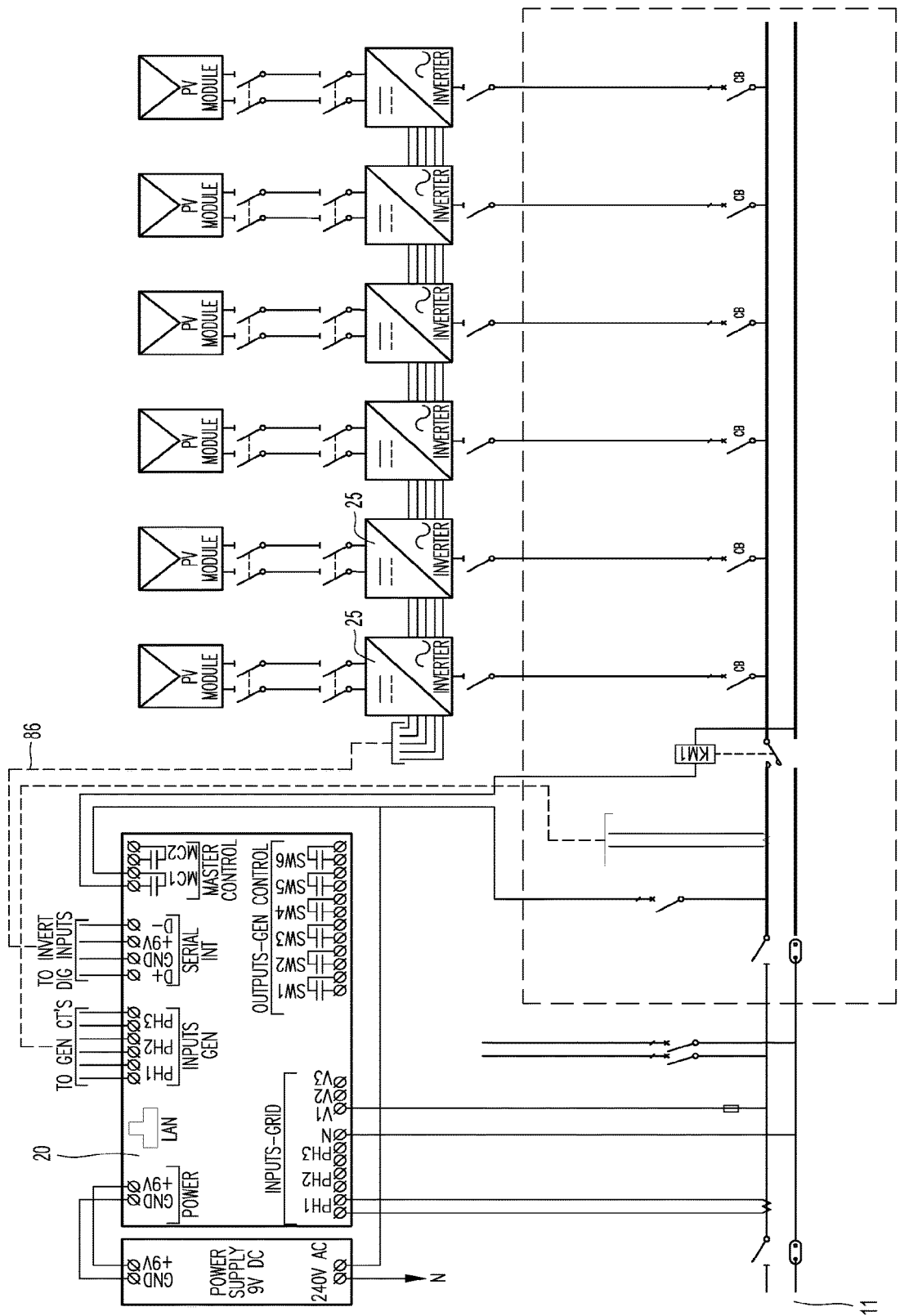
FIG. 28 is a schematic view of a further embodiment of a single phase energy load compensation system wherein power output from the inverters to the single phase is digitally controlled.

FIG. 28 shows a single phase energy load compensation system 10 wherein power output from all the inverters 25 are connected to a single phase and digitally controlled.

Figure 29:
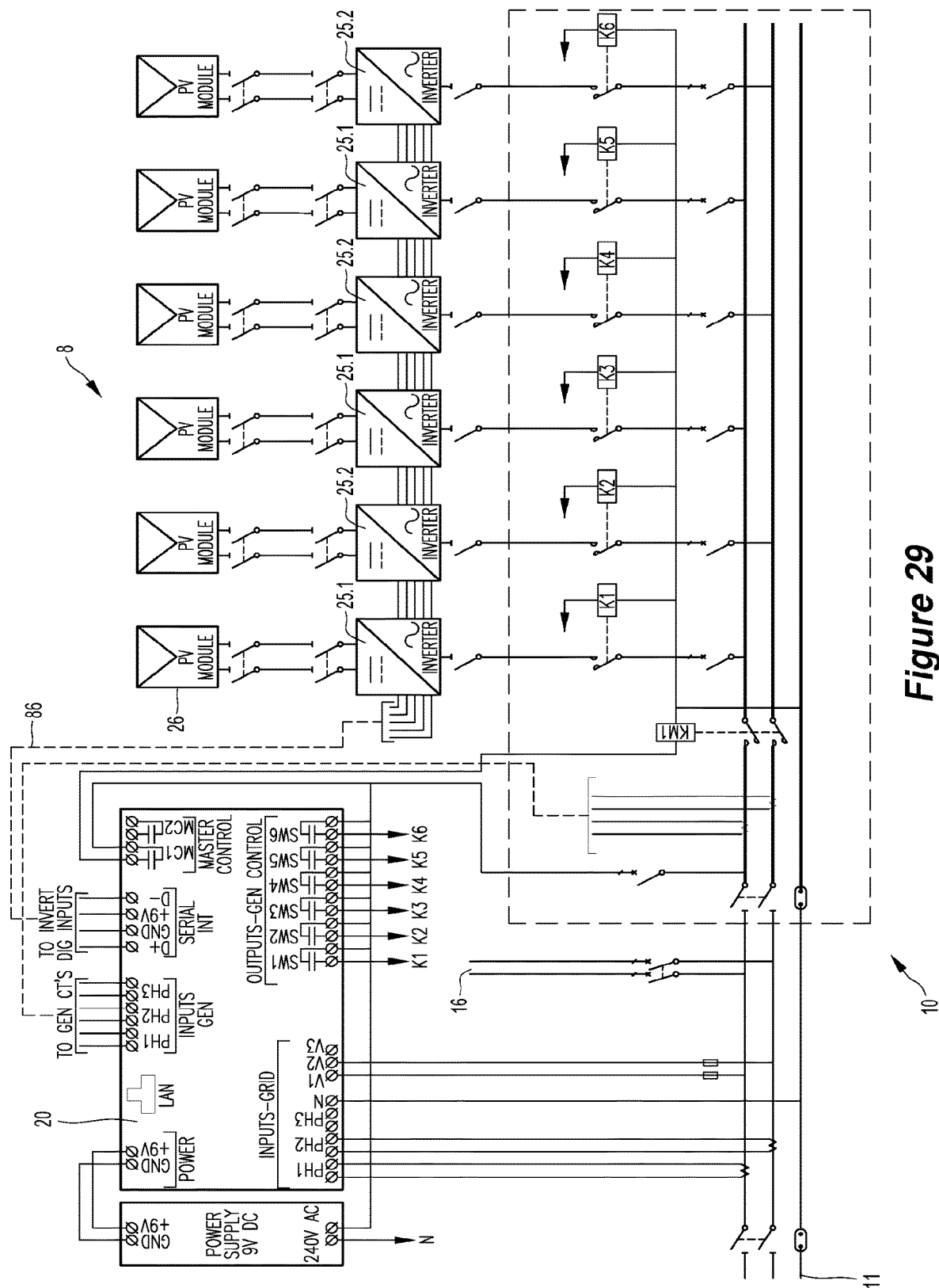
FIG. 29 is a schematic view of a further embodiment of a two phase energy load compensation system wherein power output from some of the inverters to one of the two phase is digitally controlled and power output from some of the inverters to the other of the two phase is digitally controlled.

FIG. 29 shows a two phase energy load compensation system 10 wherein power output from the inverters 25.1 are connected to one of the two phases and power output from the inverters 25.2 are connected to the other of the two phases. The inverters 25.1 and 25.2 can be digitally controlled by the device 20 to balance the phases and correct the power factor.

Figure 30:
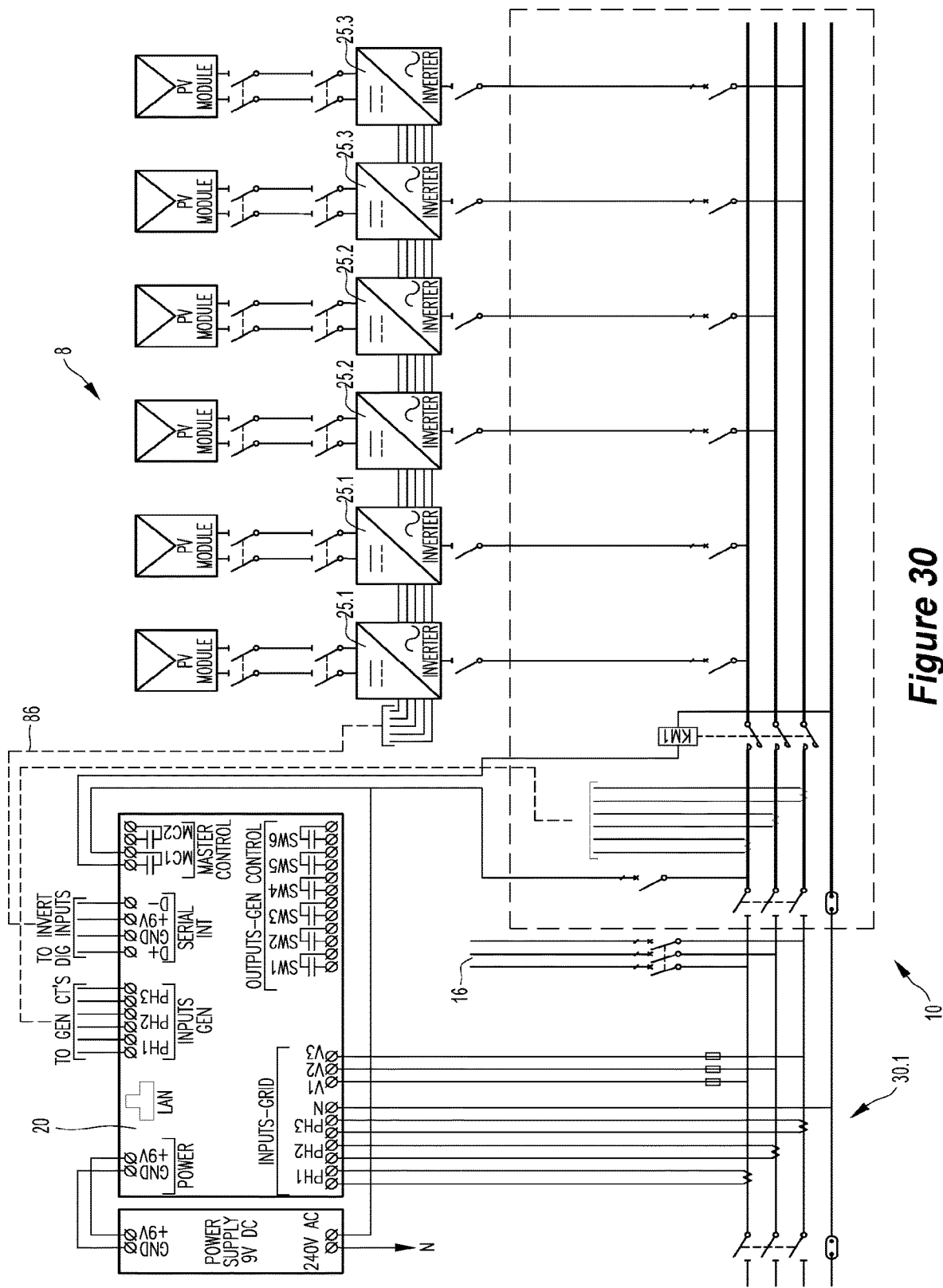
FIG. 30 is a schematic view of a further embodiment of a three phase energy load compensation system wherein power output from some of the inverters to one of the three phases is digitally controlled and power output from some of the inverters to a second of the three phases is digitally controlled and power output the remaining inverters to a third of the three phases is digitally controlled.

FIG. 30 shows a three phase energy load compensation system 10 wherein power output from the inverters 25.1 is connected to the first phase, the power output from the inverters 25.2 is connected to the second phase and the power output from the inverters 25.3 is connected to the third phase. The inverters 25.1, 25.2 and 25.3 can be digitally controlled by the device 20 to balance the phases and correct the power factor.

Advantages

By using renewable energy systems to power your home or business you are reducing greenhouse gas emissions and your electricity bills. The present invention provides the added advantage of being able to allow additional solar generation in an installation to be used for the purpose of compensating the load from the grid only.

Furthermore the present invention monitors and protects the grid by way of isolation from unwanted exporting of over generated renewable energy. The load compensation device in accordance with the present invention allows for the continuous measuring and monitoring of forward and reverse direction of power supply in the mains power supply of an installation. The present invention manages and limits the export of power to the mains supply by way of isolation or digital control of the inverter power output. Likewise both the renewable energy source and componentry and the mains power componentry are energised to connect therefore any fault or failure in the system all items are protected on de-energise.

The present invention also extends to the retrofitting of existing installations therefore allowing for the extended ability to easily fit the present invention to an inverter in a renewable energy system. Likewise upon failure of an inverter the present invention extends to the fitting of a new inverter with the load compensation circuitry installed within the inverter.

The ability of the present invention to monitor power flow at a point and adjust the current output of the inverter is particularly important when considering the real and reactive power flow to the load. A number of advantages exist in the ability to monitor the reactive power or power factor at the same point or any other relative point and the ability to adjust the supply of reactive power, power factor or phase position of the current output to suit the load. Apart from power factor correction, current loads and minimising voltage rises the present invention also allows the network or retailer who supplies the power the ability to minimise voltage rise issues on the network created by the renewable energy site, minimise power quality issues transposed to the renewable energy site and also minimise taking needed reactive power from the grid. For the networks, suppling reactive power is an expense and is not something they can properly measure and charge for.

The present invention provides a consumer with the ability to manage the output of their renewable energy supply using the AC side and the load on the mains supply.

Variations

It will be realized that the foregoing has been given by way of illustrative example only and that all other modifications and variations as would be apparent to persons skilled in the art are deemed to fall within the broad scope and ambit of the invention as herein set forth.

In the specification the term "comprising" shall be understood to have a broad meaning similar to the term "including" and will be understood to imply the inclusion of a stated integer or step or group of integers or steps but not the exclusion of any other integer or step or group of integers or steps. This definition also applies to variations on the term "comprising" such as "comprise" and "comprises".

The invention claimed is:

1. A method of controlling an inverter energy system including one or more inverters supplying power to a site, the inverter energy system connected to a mains power supply and to a site load, the method including
monitoring, at a monitoring point at the site, the forward or reverse power flow into or out of the mains power supply;
setting a rate limit for power flow into or out of the mains power supply; and
controlling the supply of power from the inverter energy system so that the power flow into or out of the mains power supply is controlled to be within the rate limit,
wherein the rate limit is a set power consumption limit of power flow out of the mains power supply; and
wherein control of the supply of energy from the inverter energy system includes electronic control of the power output from one or more of the inverters.

2. The method of claim 1, wherein the set power consumption limit is an upper limit.

3. The method of claim 1, wherein the set power consumption limit is a lower limit.

4. The method of claim 3, wherein the set power consumption lower limit is at or close to 0 kW, so as to approximately balance the rate of supply of power from the inverter energy system with the rate of power use by the site load.

5. The method of claim 2, wherein the inverter energy system includes two or more inverter energy strings, the upper power consumption limit selected to be at or larger than the expected maximum power supply from an inverter of one of the inverter energy strings.

6. The method of claim 1, wherein the rate limit includes the set power consumption limit and a set power export limit for power flow into the mains power supply.

7. The method of claim 1, wherein control of the supply of energy from the inverter energy system includes mechanically or electrically isolating an inverter of one of a number of inverter energy strings of the inverter energy system.

8. The method of claim 7, wherein the inverter energy system includes two or more inverters and control of the supply of energy from the inverter energy source includes mechanically or electrically isolating one or more of the inverters.

9. The method of claim 8, wherein a first inverter of the inverter energy system is isolated upon reverse power flow or a fault condition being detected at the monitoring point.

10. The method of claim 9, wherein a further inverter of the inverter energy system is isolated upon a fault condition being detected at the monitoring point, but the further inverter is not isolated due to reverse power flow being detected at the monitoring point.

11. The method of claim 1, wherein the control of the supply of energy from the inverter energy system further includes mechanically or electrically isolating one or more of the inverters.

12. The method of claim 11, wherein the electronic control of the power output from an inverter is digital control of the inverters.

13. The method of claim 1, wherein the electronic control of the power output from an inverter is digital control of the inverters.

14. The method of claim 1, wherein monitoring the forward or reverse power flow into or out of the mains power supply includes sensing the voltage and/or a current to sense the load on the mains power supply.

15. The method of claim 1, wherein the inverter energy system includes two or more inverter energy strings, each inverter energy string comprising a supply of renewable energy connected to an inverter.

16. The method of claim 14, wherein the supply of renewable energy is an array of photovoltaic panels.

17. The method of claim 1, wherein the inverter energy system includes a first inverter energy string and a further inverter energy string, the method including when power is in the forward direction connecting said further inverter energy string to compensate for the usage of load from the mains power supply and when forward power or load decreases isolating said further inverter energy string to prevent over generation from the further energy string above the rate limit.

* * * * *